(12) United States Patent
Pentlehner et al.

(10) Patent No.: US 12,312,522 B2
(45) Date of Patent: May 27, 2025

(54) ORGANIC OPTOELECTRONIC APPARATUS

(71) Applicant: PICTIVA DISPLAYS INTERNATIONAL LIMITED, Dublin (IE)

(72) Inventors: Dominik Pentlehner, Regensburg (DE); Andreas Rausch, Regensburg (DE)

(73) Assignee: Pictiva Displays International Limited, Dublin (IE)

( * ) Notice: Subject to any disclaimer, the term of this patent is extended or adjusted under 35 U.S.C. 154(b) by 485 days.

(21) Appl. No.: 15/128,099

(22) PCT Filed: Mar. 16, 2015

(86) PCT No.: PCT/EP2015/055443
§ 371 (c)(1),
(2) Date: Sep. 21, 2016

(87) PCT Pub. No.: WO2015/140110
PCT Pub. Date: Sep. 24, 2015

(65) Prior Publication Data
US 2017/0125695 A1   May 4, 2017

(30) Foreign Application Priority Data
Mar. 21, 2014   (DE) .......................... 102014103943.2

(51) Int. Cl.
*C09K 11/06* (2006.01)
*H10K 50/11* (2023.01)
(Continued)

(52) U.S. Cl.
CPC ............ *C09K 11/06* (2013.01); *H10K 50/125* (2023.02); *H10K 50/13* (2023.02); *H10K 50/131* (2023.02);
(Continued)

(58) Field of Classification Search
CPC ............ C09K 11/06; C09K 2211/1007; C09K 2211/1011; C09K 2211/1029;
(Continued)

(56) References Cited

U.S. PATENT DOCUMENTS

| | | | |
|---|---|---|---|
| 4,647,400 A | * | 3/1987 | Dubroca ................ C09K 11/06 252/301.16 |
| 6,869,695 B2 | | 3/2005 | Thompson et al. |

(Continued)

FOREIGN PATENT DOCUMENTS

| | | |
|---|---|---|
| DE | 102011076791 A1 | 12/2012 |
| WO | 2004005280 A1 | 1/2004 |
| WO | 2010/066245 A1 | 6/2010 |

OTHER PUBLICATIONS

Baranoff et al. Dalton Trans., 2015, 44, 8318-8329 (Year: 2015).*
(Continued)

*Primary Examiner* — Elizabeth M. Dahlburg
(74) *Attorney, Agent, or Firm* — Botos Churchill IP Law LLP

(57) ABSTRACT

The invention relates to an organic optoelectronic apparatus comprising: a first electrode (2), a radiation-emitting region (4) arranged between the first and second electrodes, and a second electrode (9), wherein the first and second electrodes can inject charge carriers of different polarity into the radiation-emitting region, wherein the radiation-emitting region (4) has a dual emitter and a further emitter, wherein the further emitter is transferred by the charge carrier into an electronically excited state and, on the transition into the basic electronic state from this electronically excited state, emits radiation, and wherein the dual emitter has a first electronically excited state and a second electronically excited state, which can be reached from the first electronically excited state by intramolecular proton transfer or intramolecular charge transfer, and the dual emitter has an (Continued)

Figure 1:
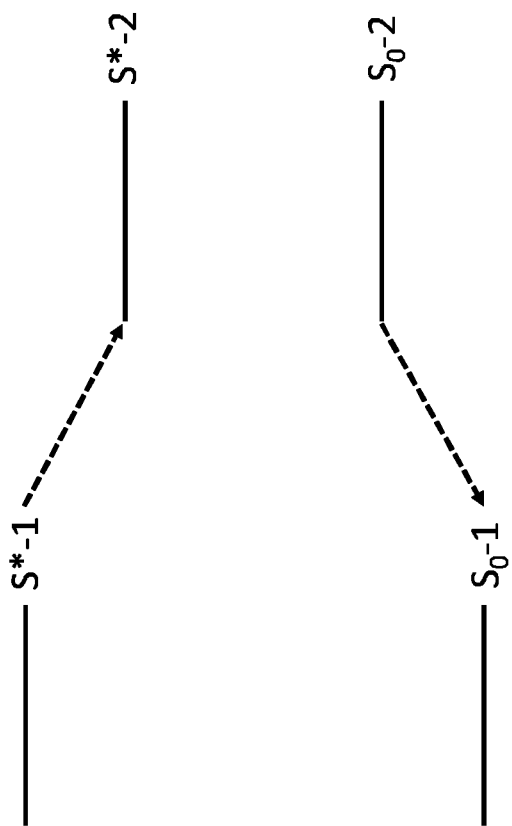

emission starting from the second electronically excited state into a second basic state. The radiation emitted by this apparatus has an improved CRI value owing to the simultaneous use of a dual emitter and a further emitter.

7 Claims, 9 Drawing Sheets

(51) Int. Cl.
| | |
|---|---|
| *H10K 50/125* | (2023.01) |
| *H10K 50/13* | (2023.01) |
| *H10K 85/60* | (2023.01) |
| *H10K 50/15* | (2023.01) |
| *H10K 50/16* | (2023.01) |
| *H10K 50/17* | (2023.01) |
| *H10K 101/10* | (2023.01) |

(52) U.S. Cl.
CPC ......... *H10K 85/611* (2023.02); *H10K 85/615* (2023.02); *H10K 85/622* (2023.02); *H10K 85/6565* (2023.02); *H10K 85/6572* (2023.02); *C09K 2211/1007* (2013.01); *C09K 2211/1011* (2013.01); *C09K 2211/1029* (2013.01); *C09K 2211/1048* (2013.01); *H10K 50/11* (2023.02); *H10K 50/15* (2023.02); *H10K 50/16* (2023.02); *H10K 50/17* (2023.02); *H10K 50/171* (2023.02); *H10K 85/633* (2023.02); *H10K 85/654* (2023.02); *H10K 2101/10* (2023.02)

(58) Field of Classification Search
CPC ..... C09K 2211/1048; C09K 2211/1033–1085; C09K 2211/185; C09K 2211/183; C09K 2211/188; H01L 51/0051; H01L 51/0052; H01L 51/0054; H01L 51/006; H01L 51/0067; H01L 51/007; H01L 51/0072; H01L 51/5016; H01L 51/5036; H01L 51/504; H01L 51/5044; H01L 51/5056; H01L 51/5072; H01L 51/5088; H01L 51/5092; H01L 51/5206; H01L 51/5221; H01L 51/0071; H01L 51/0085; H01L 51/0084; H01L 51/0086; H01L 51/0088; H01L 51/0087; H01L 51/0091; C07F 15/0033; C07F 15/0073; C07F 15/0046; C07F 15/002; C07F 15/0086; C07F 13/00; C07F 1/12; C07F 1/08; H10K 50/11; H10K 50/125; H10K 50/13; H10K 50/131; H10K 50/15; H10K 50/16; H10K 50/17; H10K 50/171; H10K 50/19; H10K 50/81; H10K 50/82; H10K 59/32; H10K 85/6572; H10K 85/611; H10K 85/615; H10K 85/622; H10K 85/6565; H10K 85/633; H10K 85/654; H10K 2101/10
USPC ...... 428/690, 691, 917, 411, 433, 6; 427/58, 427/66; 313/498, 499, 500, 501, 502, 313/503, 504, 505, 506, 507, 508, 509, 313/510, 511, 512; 257/40, 88, 89, 90, 257/91, 92, 93, 94, 95, 96, 97, 98, 99, 257/100, 101, 102, E51.001, E51.002, 257/E51.003, E51.004, E51.005, E51.006, 257/E51.007, E51.008, E51.009, E51.01, 257/E51.011, E51.012, E51.013, E51.014, 257/E51.015, E51.016, E51.017, E51.018, 257/E51.019, E51.02, E51.021, E51.022, 257/E51.023, E51.024, E51.025, E51.026, 257/E51.027, E51.028, E51.029, E51.03, 257/E51.31, E51.32, E51.33, E51.34, 257/E51.35, E51.36, E51.37, E51.38, 257/E51.39, E51.04, E51.041, E51.042, 257/E51.043, E51.044, E51.045, E51.046, 257/E51.047, E51.048, E51.049, E51.05, 257/E51.051, E51.052; 252/301.16, 252/301.17, 301.18, 301.19, 301.2, 252/301.21, 301.22, 301.23, 301.24, 252/301.25, 301.26, 301.27, 301.28, 252/301.29, 301.3, 301.31, 301.32, 252/301.33, 301.34, 301.35

See application file for complete search history.

(56) References Cited

U.S. PATENT DOCUMENTS

| | | | |
|---|---|---|---|
| 2004/0032205 A1* | 2/2004 | Hack ................. | H01L 27/3211 313/504 |
| 2010/0301317 A1* | 12/2010 | Nowatari ............... | B82Y 10/00 257/40 |
| 2012/0046472 A1 | 2/2012 | Park et al. | |
| 2012/0153266 A1 | 6/2012 | Thompson et al. | |
| 2017/0324007 A1* | 11/2017 | Pentlehner .......... | C07D 209/08 |

OTHER PUBLICATIONS

Hu et al. Synthetic Metals 137 (2003) 1123-1124 (Year: 2003).*
Park et al. J. Am. Chem. Soc. 2009, 131, 14043-14049 (Year: 2009).*
Kim, S. et al., "White Luminescence from Polymer Thin Films Containing Excited-State Intramolecular Proton-Transfer Dyes", WILEY-VCH, Adv. Mater., vol. 17, 2005, pp. 2077-2082.
Kim, S. H. et al., "Organic Light-Emitting Diodes with a White-Emitting Molecule: Emission Mechanism and Device Characteristics", WILEY-VCH, Adv. Funct. Mater., vol. 21, 2011, pp. 644-651.
Park, S. et al., "A White-Light Emitting Molecule: Frustrated Energy Transfer between Constituent Emitting Centers", J. Am. Chem. Soc., vol. 131, 2009, pp. 14043-14049.
Kalinowski, J. et al., "Mixing of Excimer and Exciplex Emission: A New Way to Improve White Light Emitting Organic Electrophosphorescent Diodes", WILEY-VCH, Adv. Mater., vol. 19, 2007, pp. 4000-4005.
Kamtekar, K. T. et al., Recent Advances in White Organic Light-Emitting Materials and Devices (WOLEDs), WILEY-VCH, Adv. Mater., vol. 22, 2010, pp. 572-582.
Park, S. Y. et al., "25.1: Invited Paper: White-Emitting Molecule: "Molecular Pixel" from Covalently Bonded Sub-Pixels", SID 10 Digest, 2010, pp. 350-352.
Zhao, J. et al., "Excited State Intramolecular Proton Transfer (ESIPT): from Principal Photophysics to the Development of New Chromophores and Applications in Fluorescent Molecular Probes and Luminescent Materials", Phys. Chem., vol. 14, 2012, pp. 8803-8817.
Zhou, G. et al., "Duplicating "Sunlight" from Simple WOLEDs for Lighting Applications", The Royal Society of Chemistry, Chem. Commun., 2009, pp. 3574-3576.
Grabowski, Z. et al., "Structural Changes Accompanying Intramolecular Electron Transfer: Focus on Twisted Intramolecular Charge-Transfer States and Structures", Chem. Rev., vol. 103, 2003, pp. 3899-4031.
Jou, J-H et al., "High-Efficiency, Very High Color Rendering White Organic Light-Emitting Diode with a High Triplet Interlayer", J. Mater. Chem., vol. 21, 2011, pp. 18523-18526.
Kwon, J. E. et al., "Advanced Organic Optoelectronic Materials: Harnessing Excited-State Intramolecular Proton Transfer (ESIPT) Process", Adv. Mater., 2011, vol. 23, pp. 3615-3642.

* cited by examiner

ORGANIC OPTOELECTRONIC APPARATUS

The present invention relates to an organic optoelectronic apparatus.

This patent application claims priority from German patent application DE 10 2014 103 943.2, whose disclosure content is hereby included by reference.

In order to produce organic optoelectronic apparatuses, such as organic light-emitting diodes (OLEDs), which comprise a high Color Rendering Index (CRI), the radiations of different emitters which each emit light in another part of the visible spectral range are typically combined with one another. The color rendering index is a characteristic number describing the quality of the color rendering of a light source. The larger the CRI value (maximum 100) the higher the similarity of the radiation emitted by a light source to that of a reference radiator. However, a higher-energy radiation can be extinguished by lower-energy emitters, e.g. by reabsorption or by energy transmission. In order to avoid these extinguishing processes, the individual emitters are arranged in different layers, wherein the respective layers can be separated from one another by further layers located therebetween. However, the use of a plurality of different layers has the disadvantage that injection barriers for charge carriers can be produced on the boundary surface between two layers, which results in an increased operating voltage.

In addition to the possibility of combining the emission of different emitters, it is possible to use emitters which from the outset emit radiation in a spectrally broad range.

The object of at least one embodiment of the invention is to provide an organic optoelectronic apparatus having an improved CRI value. This object is achieved by an organic optoelectronic apparatus according to claim 1. Advantageous developments of the organic optoelectronic apparatus are described in further dependent claims.

According to claim 1, the invention relates to an organic optoelectronic apparatus, having:
  a first electrode,
  a radiation-emitting region arranged between the first and second electrode
  a second electrode, wherein the first and second electrodes can inject charge carriers of different polarity into the radiation-emitting region, wherein
  the radiation emitting region comprises a dual emitter and a further emitter,
  wherein the further emitter is converted by the charge carriers into an electronically excited state and emits a radiation during the transition to the basic electronic state from this electronically excited state and
  wherein the dual emitter comprises a first electronically excited state and a second electronically excited state which can be achieved from the first electronically excited state by intramolecular proton transfer or intramolecular charge transfer and the dual emitter comprises an emission starting from the second electronically excited state.

An organic optoelectronic apparatus is provided which comprises a first electrode, a radiation-emitting region and a second electrode. The radiation-emitting region is arranged between the first and second electrodes. Further, non-emitting layers can be present between the electrodes and the radiation-emitting region. The two electrodes inject charge carriers of different polarity, that is to say electrons and holes, into the radiation-emitting region in which a dual emitter and a further emitter are arranged.

With regard to the basic structure of an organic optoelectronic, radiation-emitting device, e.g. with regard to the structure, the layer composition and the materials of the organic functional layers, reference is hereby made to the document WO 2010/066245 A1 which is hereby expressly incorporated by reference in relation to the basic structure of the organic optoelectronic devices.

In the case of the organic optoelectronic devices, one of the two electrodes is arranged on a substrate. The substrate can comprise e.g. one or a plurality of materials in the form of a layer, a plate, a film or a laminate which are selected from glass, quartz, synthetic material, metal and silicon wafer. In a particularly preferred manner, the substrate comprises, or consists of, glass, e.g. in the form of a glass layer, glass film or glass plate.

The two electrodes, between which the radiation-emitting region and the other organic functional layers are arranged, can both be e.g. translucent, so that the light which is emitted in the organic optoelectronic apparatus and is generated in the radiation-emitting region between the two electrodes can be radiated in the direction of the substrate but also in the direction away from the substrate. Furthermore, e.g. all of the layers of the organic optoelectronic, radiation-emitting device can be translucent, so that the device forms a translucent and in particular a transparent OLED.

Furthermore, it may also be possible that one of the two electrodes, between which the organic functional layers and the radiation-emitting region are arranged, is formed in a non-translucent manner and preferably in a reflective manner, so that the radiation generated in the radiation-emitting region between the two electrodes can be radiated only in one direction through the translucent electrode. If the electrode arranged on the substrate is formed in a translucent manner and if the substrate is also formed in a translucent manner, then this is also referred to as a so-called "bottom emitter". Should the electrode facing away from the substrate be translucent, then this is referred to as a so-called "top emitter".

The first electrode and the second electrode can comprise, independently of each other, a material which is selected from a group which comprises metals, electrically conductive polymers, transition metal oxides and transparent conductive oxides (TCO). The electrodes can also be layer stacks of a plurality of layers of the same or different metals or of the same or different TCOs.

Suitable metals are e.g. Ag, Pt, Au, Mg, Al, Ba, In, Ca, Sm or Li, as well as compounds, combinations or alloys thereof.

Transparent conductive oxides are transparent, conductive materials, generally metal oxides, such as for example zinc oxide, tin oxide, cadmium oxide, titanium dioxide, indium oxide or indium-tin oxide (ITO).

In addition to binary metal-oxygen compounds, such as e.g. $ZnO$, $SnO_2$ or $In_2O_3$, ternary metal-oxygen compounds, such as e.g. $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, TCOs do not necessarily correspond to a stoichiometric composition and may also be p- or n-doped.

By means of the recombination of two charge carriers of different polarity and the formation of excitons, bonded electron-hole pairs on the further emitter and the dual emitter, they are converted into an electronically excited state. The further emitter emits a radiation during the transition from the electronically excited state to the basic electronic state.

However, in contrast to the further emitter, the dual emitter comprises a first electronically excited state and a second electronically excited state which can be achieved from the first electronically excited state by intramolecular proton transfer or intramolecular charge transfer, wherein the dual emitter comprises at least one emission starting from the second electronically excited state.

By combining a dual emitter with a further emitter, the organic optoelectronic apparatus emits a radiation which is formed by superimposing the radiation output by the two emitters. The combination of the dual emitter with the further emitter advantageously increases the CRI of the total radiation from the two emitters emitted by the organic optoelectronic apparatus.

In particular, in contrast to the dual emitter, the further emitter cannot comprise any intramolecular charge transfer or intramolecular proton transfer. Furthermore, the dual emitter can comprise an emission of radiation either only from the second electronically excited state or in addition can also comprise, according to further embodiments of the present invention, an emission starting from the first electronically excited state.

If the intramolecular proton transfer or the intramolecular charge transfer during the transition starting from the first electronically excited state to the second electronically excited state is effected more rapidly than the radiation-emitting decomposition starting from the first electronically excited state into the first basic electronic state, the dual emitter comprises an emission mainly from the second electronically excited state, that is to say more than 90%, more than 95% or more than 97%. In one exemplified embodiment, dual emitters are used in which the transition starting from the first electronically excited state to the second electronically excited state is effected within a time period ≤10 ps, preferably ≤1 ps, which results in an emission of more than 90%, particularly preferably of more than 95% and most preferably of more than 97% being effected from the second excited electronic state in comparison with an emission from the first excited electronic state.

The wavelength of the light emitted from these two electronically excited states can be shifted by several 10 nm with respect to one another and can comprise a different spectral form. The emitted radiation from the second electronically excited state is less energetic than the emitted radiation from the first electronically excited state (see e.g. FIG. 1).

The further emitter and the dual emitter can be distinguished from one another by reason of their different optical properties, in particular by a comparison of the respective absorption and emission spectra.

The absorption spectrum of the further emitter comprises absorption bands which can be attributed to transitions starting from the basic electronic state to electronically excited states by reason of the absorption of photons. In a similar manner thereto, the emission spectrum of the further emitter also comprises emission bands which correspond to the emission of radiation from the electronically excited state under relaxation to the basic electronic state. The absorption spectrum of the dual emitter also comprises absorption bands which can be attributed to the induction of electronic transitions starting from the first basic electronic state to the electronically excited states by reason of the absorption of a photon. However, depending upon the external circumstances the emission spectrum of the dual emitter can comprise one or two emission bands. Two emission bands can be attributed to the radiating electronic transitions between the first electronically excited state and the second electronically excited state to the respective first and second basic electronic states. It is possible that by reason of a rapid intramolecular charge transfer or intramolecular proton transfer from the first excited electronic state to the second excited electronic state, the dual emitter also comprises predominantly, i.e. e.g. more than 90%, only one emission band. This emission band can then be attributed to a radiating transition between the second electronically excited state and the second basic state.

The emission properties, both of the further emitters used and of the dual emitters used are greatly dependent upon external parameters, such as e.g. the polarity and acidity of the matrix materials into which the emitters are introduced as dopants. Therefore, through the specific use of different matrix materials the emission color of the respective emitter can be varied and in the case of a dual emitter the ratio of the two emission bands with respect to one another can also be influenced. The matrix materials can primarily comprise charge carrier-transporting, charge-carrier-blocking and/or exciton-forming properties. In order to examine the influence of different matrix materials on the emission behavior of the dual emitter and of the further emitter, a person skilled in the art will thus introduce the emitters as dopants into layers comprising the matrix materials and then examine both their absorption and also emission spectra in dependence upon different dopant concentrations. In the case of a dual emitter in which the second excited electronic state can be achieved from the first excited electronic state by means of intramolecular charge transfer, an emission from the second excited state will increase with respect to an emission from the first excited state in general with an increasingly polar matrix material. When using increasingly non-polar matrix materials, an emission from the first excited electronic state will take place conversely to an increasing extent.

Here and hereinafter, dual emitters in which, during the transition starting from the first electronically excited state to the second electronically excited state, an intramolecular proton transfer occurs are also referred to as ESIPT (Excited State Intramolecular Proton Transfer) molecules. In the first electronically excited state the ESIPT molecules are present in the enol form, whereas in the second electronically excited state they are present in the keto form. After the transition from the second electronically excited state to the associated basic state which is referred to hereinafter as the second basic electronic state, a rapid proton return-transfer can be effected during the transition starting from the second basic electronic state to the first basic electronic state. Therefore, the second basic electronic state is scarcely populated.

However, here and hereinafter, molecules in which, during the transition starting from the first electronically excited state to the second electronically excited state, an intramolecular charge transfer occurs are also referred to as ICT (Intramolecular Charge Transfer) molecules. These molecules comprise an electron donor and acceptor group, wherein in the first electronically excited state they are initially only in a local state and the locally excited state can transition to a second electronically excited state by intramolecular charge transfer. After the transition from the second electronically excited state to the second basic electronic state, a rapid charge transfer starting from the second basic electronic state to the first basic electronic state is effected. Therefore, the second basic electronic state is scarcely populated.

In a further embodiment of the invention, the radiation-emitting region comprises a phosphorescent emitter as a further emitter and in further embodiments of the invention comprises a fluorescent dual emitter.

The fluorescent dual emitter can only use the generated singlet excitons for emission. However, the specific combination with an energetically suitable phosphorescent emitter as a further emitter can render it possible to also use the generated triplet excitons for emission because the non-radiating triplet excitons of the fluorescent dual emitter are transmitted to the phosphorescent emitter and can relax in a radiating manner at that location. As a result, in a particularly advantageous manner all of the excitons produced in the radiation-emitting region can be used for emission.

In a further embodiment of the invention, the transition starting from the second basic electronic state of the dual emitter to the first basic electronic state is more rapid that the radiating transition starting from the second electronically excited state to the second basic electronic state, for which reason the second basic electronic state of the dual emitter is scarcely populated.

Such dual emitters can emit radiation from the second electronically excited state but can absorb almost no radiation which would induce a transition starting from the second basic electronic state to the second electronically excited state. Therefore, when combining such dual emitters with further emitters in organic optoelectronic apparatuses in accordance with the invention, extinguishing process, such as reabsorption or energy transfer, can be greatly reduced. In a further exemplified embodiment, in particular dual emitters are used in which the transition starting from the second basic electronic state to the first basic electronic state is effected within a time period ≤10 ps, preferably ≤1 ps. In the case of such dual emitters, the dual emitter and also e.g. a phosphorescent further emitter can be introduced in a single radiation-emitting layer of the radiation-emitting region because it is possible to avoid an extinguishment of the emission of the phosphorescent further emitter by the second basic electronic state of the dual emitter.

In a further embodiment, the radiation-emitting region comprises ESIPT molecules as dual emitters, which display photoinduced enol-keto tautomerism. These ESIPT molecules can display the following general tautomeric bounding formulas:

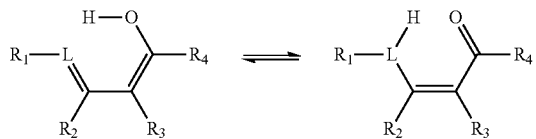

wherein L may be either nitrogen, oxygen or sulfur and R1 to R4 hydrogen, alkyl, alkenyl groups, long-chain alkyl, alkoxy, long-chain alkoxy, cycloalkyl, haloalkyl, aryl, arylenes, haloaryl, heteroaryl, heteroarylenes, heterocycloalkylenes, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, or part of a cyclic, aromatic, or heteroaromatic system. In particular, for dual emitters having these kind of general tautomeric boundary formulas, the enol form (first basic state) can exist in the non-excited state, wherein in the excited state of the enol form (first excited electronic state) the keto form (second excited electronic state and second basic state) is formed as a result of intramolecular proton transfer.

General group definition: within the description and the claims, general groups such as alkyl, alkoxy, aryl etc. are claimed and described. Unless described otherwise, the following groups within the generally described groups are preferably used within the scope of the present invention:

alkyl: linear and branched C1-C8-alkyls, long-chain alkyls: linear and branched C5-C20-alkyls,
alkenyl: C2-C6-alkenyl,
cycloalkyl: C3-C8-cycloalkyl,
alkoxy: C1-C6-alkoxy, long-chain alkoxy: linear and branched C5-C20-alkoxy,
alkylenes: selected from the group comprising: methylene; 1,1-ethylene; 1,2-ethylene; 1,1-propylidene; 1,2-propylene; 1,3-propylene; 2,2-propylidene; butan-2-ol-1,4-diyl; propan-2-ol-1,3-diyl; 1,4-butylene; cyclohexane-1,1-diyl; cyclohexane-1,2-diyl; cyclohexane-1,3-diyl; cyclohexane-1,4-diyl; cyclopentane-1,1-diyl; cyclopentane-1,2-diyl; and cyclopentane-1,3-diyl,
Aryl: selected from aromatic compounds with a molecular weight of less than 300 Da,
arylenes: selected from the group comprising: 1,2-phenylene; 1,3-phenylene; 1,4-phenylene; 1,2-naphthylene; 1,3-naphthalenylene; 1,4-naphthylene; 2,3-naphthylene; 1-hydroxy-2,3-phenylene; 1-hydroxy-2,4-phenylene; 1-hydroxy-2,5-phenylene; and 1-hydroxy-2,6-phenylene,
heteroaryl: selected from the group comprising: pyridinyl; pyrimidinyl; pyrazinyl; triazolyl; pyridazinyl; 1,3,5-triazinyl; quinoninyl; isoquinoninyl; quinoxalinyl; imidazolyl; pyrazolyl; benzimidazolyl; thiazolyl; oxazolidinyl; pyrrolyl; thiophenyl; carbazolyl; indolyl; and isoindolyl, wherein the heteroaryl may be bonded to the compound via any atom in the ring of the selected heteroaryl,
heteroarylenes: selected from the group comprising: pyridindiyl; quinolindiyl; pyrazodiyl; pyrazoldiyl; triazolediyl; pyrazindiyl; thiophendiyl; and imidazolediyl, wherein the heteroarylene acts as a bridge in the compound over any atom in the ring of the selected heteroaryl, particularly preferred are: pyridine-2,3-diyl; pyridine-2,4-diyl; pyridine-2,5-diyl; pyridine-2,6-diyl; pyridine-3,4-diyl; pyridine-3,5-diyl; quinoline-2,3-diyl; quinoline-2,4-diyl; quinoline-2,8-diyl; isoquinoline-1,3-diyl; isoquinoline-1,4-diyl; pyrazole-1,3-diyl; pyrazole-3,5-diyl; triazole-3,5-diyl; triazole-1,3-diyl; pyrazine-2,5-diyl; and imidazole-2,4-diyl, thiophene-2,5-diyl, thiophene-3,5-diyl; a C1-C6-heterocycloalkyl, selected from the group comprising: piperidinyl; piperidine; 1.4-piperazine, tetrahydrothiophene; tetrahydrofuran; 1,4,7-triazacyclononane; 1,4,8,11-tetraazacyclotetradecane; 1,4,7,10,13-pentaazacyclopentadecane; 1,4-diaza-7-thia-cyclononane; 1,4-diaza-7-oxa-cyclononane; 1,4,7,10-tetraazacyclododecane; 1,4-dioxane; 1,4,7-trithia-cyclononane; pyrrolidine; and tetrahydropyran, wherein the heteroaryl may be bonded to the C1-C6-alkyl via any atom in the ring of the selected heteroaryl,
heterocycloalkylenes: selected from the group comprising: piperidin-1,2-ylene; piperidin-2,6-ylene; piperidin-4,4-ylidene; 1,4-piperazin-1,4-ylene; 1,4-piperazin-2,3-ylene; 1,4-piperazin-2,5-ylene; 1,4-piperazin-2,6-ylene; 1,4-piperazin-1,2-ylene; 1,4-piperazin-1,3-ylene; 1,4-piperazin-1,4-ylene; tetrahydrothiophen-2,5-ylene; tetrahydrothiophen-3,4-ylene; tetrahydrothiophen-2,3-ylene; tetrahydrofuran-2,5-ylene; tetrahydrofuran-3,4-ylene; tetrahydrofuran-2,3-ylene; pyrrolidin-2,5-ylene; pyrrolidin-3,4-ylene; pyrrolidin-2,3-ylene; pyrrolidin-1,2-ylene; pyrrolidin-1,3-ylene; pyrrolidin-2,2-ylidene; 1,4,7-triazacyclonon-1,4-ylene; 1,4,7-triazacyclonon-2,3-ylene; 1,4,7-triazacyclonon-2,9-ylene; 1,4,7-triazacyclonon-3,8-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetradec-2,5-ylene; 1,4,8,11-tetraazacyclotetradec-1,2-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-1,2-ylene; 1,4,7,10-tetraazacyclododec-2,3-ylene; 1,4,7,10-tetraazacyclododec-2,2-ylidene; 1,4,7,10,13-pentaazacyclopentadec-1,4-ylene; 1,4,7,10,13-pentaazacyclopentadec-1,7-ylene; 1,4,7,10,13-pentaazacyclopentadec-2,3-ylene; 1,4,7,10,13-pentaazacyclopentadec-1,2-ylene; 1,4,7,10,13-pentaazacyclopentadec-2,2-ylidene; 1,4-diaza-7-thiacyclonon-1.4-ylene; 1,4-diaza-7-thia-cyclonon-1,2-ylene; 1,4-diaza-7-thia-cyclonon-2,3-ylene; 1,4-diaza-7-thia-cyclonon-6,8-ylene; 1,4-diaza-7-thia-cyclonon-2,2-ylidene; 1,4-diaza-7-oxa-cyclonon-1,4-ylene; 1,4-diaza-7-oxa-cyclonon-1,2-ylene; 1,4-diaza-7-oxa-cyclonon-2,3-ylene; 1,4-diaza-7-oxa-cyclonon-6,8-ylene; 1,4-diaza-7-oxa-cyclonon-2,2-ylidene; 1,4-dioxan-2,3-ylene; 1,4-dioxan-2,6-ylene; 1,4-dioxan-2,2-ylidene; tetrahydropyran-2,3-ylene; tetrahydropyran-2,6-ylene; tetrahydropyran-2,5-ylene; tetrahydropyran-2,2-ylidene; 1,4,7-trithia-cyclonon-2,3-ylene; 1,4,7-trithia-cyclonon-2,9-ylene; and 1,4,7-trithia-cyclonon-2,2-ylidene, heterocycloalkyl: selected from the group comprising: pyrrolinyl; pyrrolidinyl; morpholinyl; piperidinyl; piperazinyl; hexamethylene imine; 1,4-piperazinyl; tetrahydrothiophenyl; tetrahydrofuranyl; 1,4,7-triazacyclononanyl; 1,4,8,11-tetraazacyclotetradecanyl; 1,4,7,10,13-pentaazacyclopentadecanyl; 1,4-diaza-7-thiacyclononanyl; 1,4-diaza-7-oxacyclo-nonanyl; 1,4,7,10-tetraazacyclododecanyl; 1,4-dioxanyl; 1,4,7-trithiacyclononanyl; tetrahydropyranyl; and oxazolidinyl, wherein the heterocycloalkyl may be bonded to the compound via any atom in the ring of the selected heterocycloalkyl.

Amines: the group —N(R)2 wherein each R is independently selected from: hydrogen; C1-C6-alkyl; C1-C6-alkyl-C6H5; and phenyl, wherein if both R' are C1-C6 alkyl, both R' can form a —NC3 to NC5 heterocyclic ring, wherein the remaining alkyl chain forms alkyl substituents on the heterocyclic ring, haloalkyl: selected from the group comprising mono, di, tri-, poly and perhalogenated linear and branched C1-C8-alkyl, particularly —CF3, pseudohalogen: selected from the group comprising —CN, —SCN, —OCN, N3, —CNO and —SeCN, aryl: selected from the group comprising: phenyl; biphenyl; naphthalenyl; anthracenyl; and phenanthrenyl, arylene: selected from the group comprising: 1,2-phenylene; 1,3-phenylene; 1,4-phenylene; 1,2-naphthylene; 1,4-naphthalenylene; 2,3-naphthylene and 1-hydroxy-2,6-phenylene, heteroaryl: selected from the group comprising: pyridinyl; pyrimidinyl; quinoninyl; pyrazolyl; triazolyl; isoquinoninyl; imidazolyl; and oxazolidinyl, wherein the heteroaryl may be bonded to the compound via any atom in the ring of the selected heteroaryl, heteroarylene: selected from the group comprising: pyridine-2,3-diyl; pyridine-2,4-diyl; pyridine-2,6-diyl; pyridine-3,5-diyl; quinoline-2,3-diyl; quinoline-2,4-diyl; isoquinoline-1,3-diyl; isoquinoline-1,4-diyl; pyrazole-3,5-diyl; and imidazole-2,4-diyl, Heterocycloalkyl: selected from the group comprising: pyrrolidinyl; morpholinyl; piperidinyl; piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclododecanyl; and piperazinyl, wherein the heteroaryl may be bonded to the compound via any atom in the ring of the selected heteroaryl, heterocycloalkylenes: selected from the group comprising: piperidin-2,6-ylene; piperidin-4,4-ylidene; 1,4-piperazin-1,4-ylene; 1,4-piperazin-2,3-ylene; 1,4-piperazin-2,6-ylene; tetrahydrothiophen-2,5-ylene; tetrahydrothiophen-3,4-ylene; tetrahydrofuran-2,5-ylene; tetrahydrofuran-3,4-ylene; pyrrolidin-2,5-ylene; pyrrolidin-2,2-ylidene; 1,4,7-triazacyclonon-1,4-ylene; 1,4,7-triazacyclonon-2,3-ylene; 1,4,7-triazacyclonon-2,2-ylidene; 1,4,8,11-tetraazacyclotetradec-1,4-ylene; 1,4,8,11-tetraazacyclotetradec-1,8-ylene; 1,4,8,11-tetraazacyclotetradec-2,3-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-2,3-ylene; 1,4,7,10-tetraazacyclododec-2,2-ylidene; 1,4,7,10,13-pentaazacyclopentadec-1,4-ylene; 1,4,7,10,13-pentaazacyclopentadec-1,7-ylene; aza-7-thia-cyclonon-1,4-ylene; 1,4-diaza-7-thia-cyclonon-2,3-ylene; 1,4-diaza-7-thien-cyclonon-2,2-ylidene; 1,4-diaza-7-oxa-cyclonon-1,4-ylene; 1,4-diaza-7-oxa-cyclonon-2,3-ylene; 1,4-diaza-7-oxa-cyclonon-2,2-ylidene; 1,4-dioxan-2,6-ylene; 1,4-dioxan-2,2-ylidene; tetrahydropyran-2,6-ylene; tetrahydropyran-2,5-ylene; and tetrahydropyran-2,2-ylidene, a C1-6-alkyl-heterocycloalkyl, wherein the heterocycloalkyl is selected from the group comprising: piperidinyl; 1,4-piperazinyl; tetrahydrofuranyl; 1,4,7-triazacyclononanyl; 1,4,8,11-tetraazacyclotetradecanyl; 1,4,7,10,13-pentaazacyclopentadecanyl; 1,4,7,10-tetraazacyclododecanyl; and pyrrolidinyl, wherein the heterocycloalkyl can be bonded to the compound via any atom in the ring of the selected heterocycloalkyl.

In particular, the following molecules may be used as ESIPT molecules: benzoxazoles and benzothiazoles, particularly 2-(2-hydroxyphenyl)-benzothiazole, 2-(2'-hydroxyphenyl)benzoxazole and their derivates, which are connected to other aromatic rings such as phenyl, pyridine, naphthyl, quinoline, indole, pyrazine, acridine, anthracenes, benzo[a]pyrenes, fluoranthenes, fluorenes, pyrenes, chrysenes, phenanthrenes, which have a hydroxy or thiol group in position 2.

In particular, molecules with the following structures or tautomeric boundary formulas can also be used as ESIPT molecules:

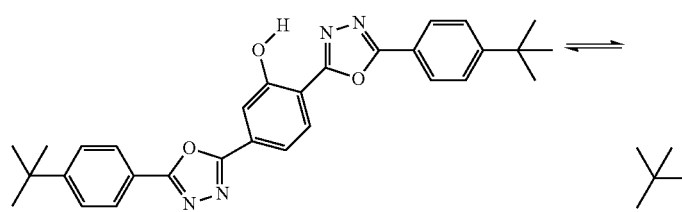
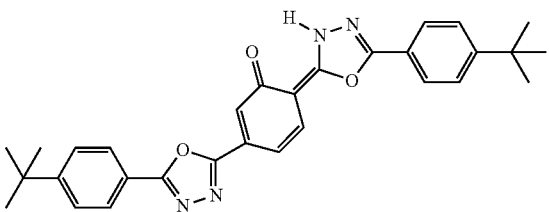
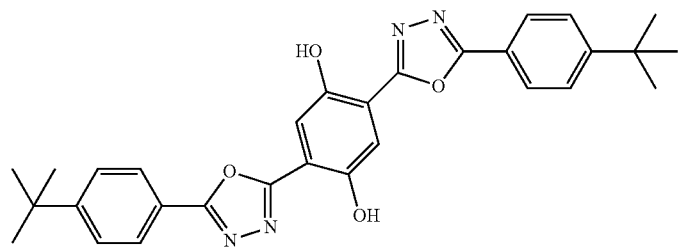
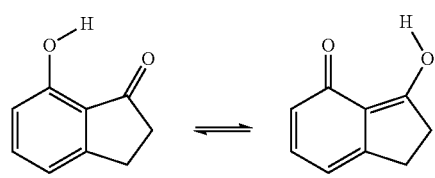
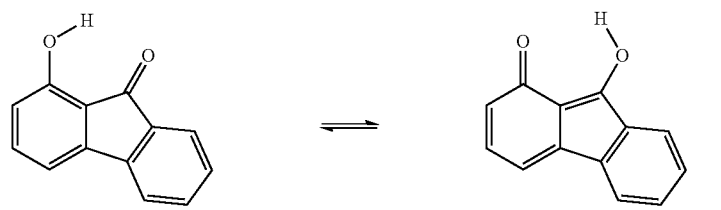
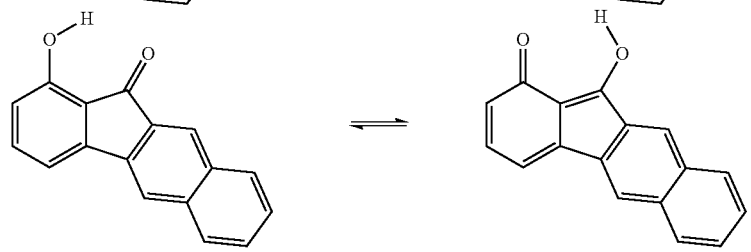
ICT molecules that can be used in the organic optoelectronic apparatus of the present invention, particularly have the following general structural formulas:
-continued
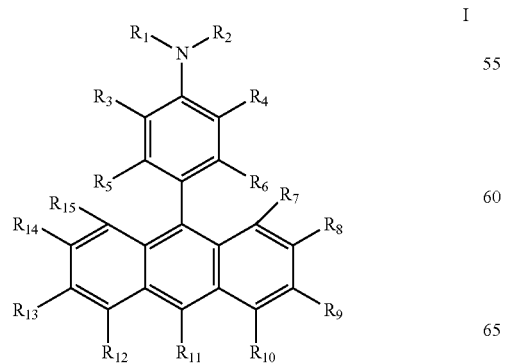
I
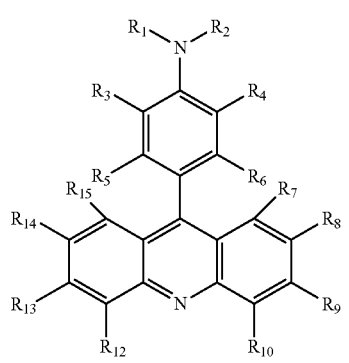
II

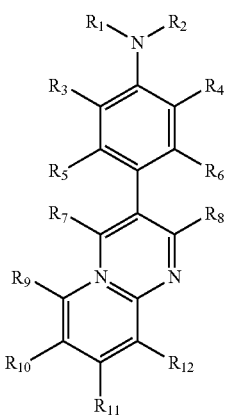

III

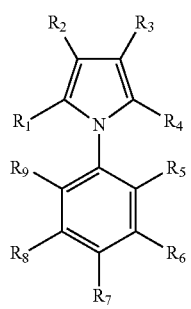

IV

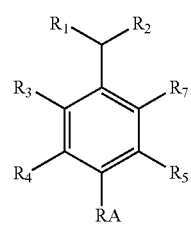

V

In these formulas the substituents $R_1$ to $R_{15}$ may have the above meanings of the substituents $R_1$ to $R_4$, wherein particularly the substituents $R_7$ to $R_{15}$ on the anthracene ring may be hydrogen, in each case independently of each other.

The substituent $R_{11}$ in the anthracene ring of formula I or substituent $R_7$ in formula IV may also be an electron-attracting group RA, for example, —CN, —SCN, or halogen. Furthermore, the substituents may be bridged to each other.

Compounds being used as ICT molecules for the dual emitter may particularly also be those specified in the review article "Structural Changes Accompanying Intramolecular Electron Transfer: Focus on Twisted Intramolecular Charge-Transfer States and Structures", Grabowski et al. Che. Rev. 2003, 3899 to 4031 on pages 3976 to 4031, which is hereby referenced in full.

The ICT molecules may particularly have electron-donator and electron-acceptor groups in the molecule by means of which the intramolecular charge transfer occurs. Molecules with the following structures may be used as ICT molecules:

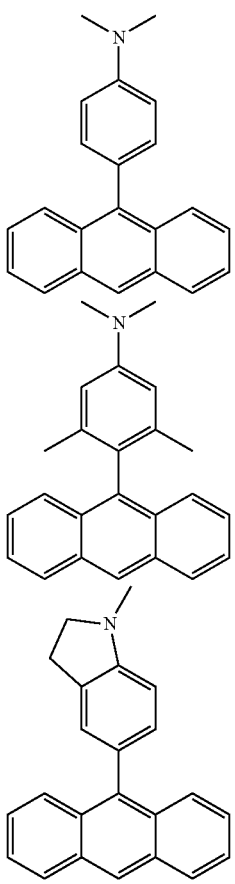

As a further emitter, a multitude of both phosphorescent and fluorescent emitter materials may be used, particularly blue, green and red phosphorescent emitters, which will be described in more detail in the following.

A blue phosphorescent emitter material may be selected from the group comprising FIrPic (bis(3,5-difluoro-2-(2-pyridyl)phenyl-(2-carboxypyridyl)iridium III), FIr6 (bis(48, 68-difluorophenylpyridinato)tetrakis(1-pyrazolyl)borate-iridium III) as well as mixtures of the aforementioned substances. The specified emitter materials have their maximum emission in the blue spectral range.

Green phosphorescent emitter material may be selected from the group comprising Ir(ppy)$_3$(tris(2-phenylpyridine) iridium(III)), Ir(mppy)$_3$(tris[2-(p-tolyl)pyridine]iridium (III)), Ir(ppy)$_2$(acac)(bis(2-phenylpyridine)(acetylacetonate) iridium(II)), Ir(mppy)$_2$(acac)(bis[2-(p-tolyl)pyridine] (acetylacetonate)iridium(III)), bis[1-(9,9-dimethyl-9H-fluoren-2-yl)-isoquinoline](acetylacetonate)-iridium(III), iridium(III)-tris(2-(4-tolyl)pyridinato-N,C2), as well as mixtures of the aforementioned substances. The specified emitter materials have their maximum emission in the green spectral range.

For red phosphorescent emitter material, an emitter material can be used that is selected from the group comprising Ir(mdq)$_2$(acac) (bis(2-methyldibenzo[f,h]-quinoxaline) (acetylacetonate)iridium(III)), iridium(III)-bis(dibenzo[f,h]-quinoxaline)(acetylacetonate), Eu(dbm)3(phen)(tris(dibenzoylmethane)phenanthroline-europium(III)), Ir(btp)$_2$(acac) (bis(2-benzo[b]thiophen-2-yl-pyridine)(acetylacetonate) iridium(III)), Ir(piq)$_2$(acac)(bis(1-phenylisoquinoline) (acetylacetonate)iridium(III)), Ir(flq)$_2$ (acac)-1(bis[1-(9,9- dimethyl-9H-fluoren-2-yl)-isoquinoline](acetylacetonate)iridium(III)), Ir(flq)$_2$(acac)-2(bis[3-(9,9-dimethyl-9H-fluoren-2-yl)-isoquinoline](acetyl acetonate)iridium(III)), bis[2-(9,9-dibutylfluorenyl)-1-isoquinoline](acetylacetonate)iridium(III), bis[2-(9,9-dihexylfluorenyl)-1-pyridine] (acetylacetonate)iridium(III), Ru(dtb-hpy)$_3$*2(PF$_6$)(tris[4,4'-di-tert-butyl-(2,2)-bipyridine]ruthenium(III)complex), Ir(2-phq)$_3$(tris(2-phenylquinoline)iridium(III)), Ir(2-phq)$_2$ (acac) (bis(2-phenylquinoline)(acetylacetonate)iridium (III)), Ir(piq)$_3$ (Tris(1-phenylisoquinoline)iridium(III)), Iridium (III)-bis(2-(2'-benzothienyl)pyridinato-N,C3') (acetylacetonate), bis(2-phenylbenzothiazolate)(acetylacetonate)iridium(III), tris(dibenzoylacetonato)-mono (phenanthroline)-europium (III), tris(dibenzoylmethane)-mono(phenanthroline)-europium (III), tris(dibenzoylmethane)-mono(5-aminophenanthroline)-europium (III), tris(dinaphthoylmethane)-mono(phenanthroline)-europium (III), tris(4-brombenzoylmethane)-mono(phenanthroline)-europium (III), tris(dibiphenoylmethane)-mono (phenanthroline)-europium (III), tris(dibenzoylmethane)-mono(4,7-dimethylphenanthroline)-europium (III), tris (dibenzoylmethane)-mono(4,7-dimethylphenanthroline-disulfonic acid)-europium (III)-di sodium salt, tris[di(4-(2-(2-thoxyethoxy)ethoxy)benzoyl-methane)]-mono(phenanthroline)-europium (III), tris[di(4-(2-(2-thoxyethoxy)ethoxy) benzoylmethane)]-mono(5-aminophenanthroline)-europium (III), osmium(II)bis(3-trifluoromethyl)-5-(4-tert-butyl-pyridyl)-1,2,4-triazolate)diphenylmethylphosphine, osmium (II)bis(3-trifluoromethyl)-5-(2-pyridyl)-1,2,4-triazole)diphenylmethylphosphine, osmium(II)bis(3-trifluoromethyl)-5-(4-tert-butyl-pyridyl)-1,2,4-triazolate)dimethylphenylphosphine, osmium(II)bis(3-trifluoromethyl)-5-(2-pyridyl)-pyrazolate)dimethylphenylphosphine, as well as mixtures of the aforementioned substances. The specified emitter materials have their maximum emission in the red spectral range.

Furthermore, fluorescent emitters may be also used as the further emitter, for example Zn(BIZ)$_2$ bis[2-(2-hydroxyphenyl)benzothiazolato]zinc(II), tris(8-hydroxyquinolato)aluminium (III), tris(2-methyl,8-hydroxyquinolato)aluminium (III), tris(8-hydroxyquinolato)gallium (III), tris(3-methyl-1-phenyl-4-trimethyl-acetyl-5-pyrazoline)terbium (III).

The dual emitter as well as the further emitter can be introduced as doping agents in charge carrier transporting matrix materials. This may be selected, for example, from a group consisting of mCP (1,3-bis(carbazol-9-yl)benzene), TCP (1,3,5-tris(carbazol)-9-yl)benzene), TCTA (4,4',4''-tris (carbazol-9-yl)triphenylamine), TPBi (1,3,5-tris(1-phenyl-1H-benzimidazol-2-yl)benzene), CBP (4,4'-bis(carbazol-9-yl)biphenyl), CDBP (4,4'-bis(9-carbazolyl)-2,2'-dimethylbiphenyl), (DMFL-CBP 4,4'-bis(carbazol-9-yl)-9,9-dimethylfluorene), FL-4CBP (4,4'-bis(carbazol-9-yl)-9,9-bis(9-phenyl-9H-carbazol)fluorene), FL-2CBP (9,9-bis(4-carbazol-9-yl)-phenyl)fluorene, also abbreviated to CPF), DPFL-CBP (4,4'-bis(carbazol-9-yl)-9,9-ditolylfluorene), FL-2CBP (9,9-bis(9-phenyl-9H-carbazol)fluorene), Spiro-CBP (2,2',7,7'-tetrakis(carbazol-9-yl)-9,9'-spirobifluorene), ADN (9,10-di(naphth-2-yl)anthracene, TBADN (3-tert-butyl-9,10-di(naphth-2-yl)anthracene, DPVBi (4,4'-bis(2,2-diphenyl-ethen-1-yl)-4,4'dimethylphenyl), p-DMDPVBi (4,4'-bis(2,2-diphenyl-ethen-1-yl)-4,4'-dimethylphenyl), TDAF (tert(9,9-diaryfluorene)), BSBF (2-(9,9'-spirobifluoren-2-yl)-9,9'-spirobifluorene), TSBF (2,7-bis(9,9'-spirobifluoren-2-yl)-9,9'-spirobifluorene), BDAF (9,9-diarylfluorene), p-TDPVBi (4,4'-bis(2,2-diphenylethen-1-yl)-4,4'-di-(tert-butyl)phenyl), TPB3 (1,3,5-Tri(pyren-1-yl)benzol), PBD (2-(4-Biphenylyl)-5-(4-tertbutylphenyl)-1,3,4-oxadiazol), BCP (2,9-dimethyl-4,7-diphenyl-1,10-phenanthroline), BP-OXD-Bpy (6,6'-bis[5-(biphenyl-4-yl)-1,3,4-oxadiazo-2-yl]-2,2'-bipyridyl), NTAZ (4-(naphth-1-yl)-3,5-diphenyl-4H-1,2,4-triazole), Bpy-OXD (1,3-bis[2-(2,2'-bipyrid-6-yl)-1,3,4-oxadiazo-5-yl]benzene), BPhen (4,7-diphenyl-1,10-phenanthroline), TAZ (3-(4-biphenylyl)-4-phenyl-5-tert-butylphenyl-1,2,4-triazole), PADN (2-phenyl-9,10-di(naphth-2-yl)-anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis (naphth-2-yl)-4,7-diphenyl-1,10-phenanthroline), 3 TPYMB (tris(2,4,6-trimethyl-3-(pyrid-3-yl)phenyl)borane), 2-NPIP (1-methyl-2-(4-(naphth-2-yl)phenyl)-1H-imidazo[4,5-f][1,10]phenanthroline), Liq (8-hydroxyquinolinolato-lithium) and Alq (bis(2-methyl-8-quinolinolate)-4-(phenylphenolato)aluminium) as well as mixtures of the aforementioned substances. Preferred matrix materials are aromatic materials with a high nitrogen content, for instance the materials mCP, TCTA, TPBi, BCP, BPhen, CBP, CDBP and CPF (i.e. FL-2CBP) or metal complexes such as Alq.

In a further embodiment of the present invention, by reason of the superimposition of the radiation of the further emitter and of the dual emitter, organically optoelectronic apparatuses can be produced which comprise a CRI value of ≥80, preferably of ≥90 and particularly preferably of ≥95. In order to calculate the CRI value, the light source is spectrally measured and compared with a reference light source. The CRI value is a measurement of the deviation between the emission spectra of the light source and the reference light source. A high CRI value can be achieved by virtue of the fact that the white spectrum of the organic optoelectronic apparatus in the visible range is as similar as possible to the spectrum of a black radiator, i.e. covers the visible range as broadly as possible and in particular a high level of intensity is achieved even at the long-wave, red end of the emission range.

The radiation-emitting region in which the dual emitter and the further emitter are arranged can comprise one or a plurality of organic radiation-emitting layers, wherein the dual emitter and the further emitter can be arranged in the different layers or in the same radiation-emitting layer of the radiation-emitting region. Furthermore, intermediate layers can also be present between the radiation-emitting layers in the radiation-emitting region of the organic optoelectronic apparatus. These intermediate layers can be in particular charge carrier-transporting layers (e.g. p-doped or n-doped layers), electrically insulating layers or charge generating layers (CGL). These charge generating layers can comprise n-doped regions and p-doped regions, in particular n-doped layers and p-doped layers which inject electrons and holes into the adjoining layers.

In a further embodiment of the invention, the radiation-emitting region comprises a radiation-emitting layer in which both the dual emitter and the further emitter can be arranged.

If the dual emitter comprises a rapid back reaction starting from the second basic electronic state to the first basic electronic state, the second basic electronic state is scarcely populated.

Figure 2:
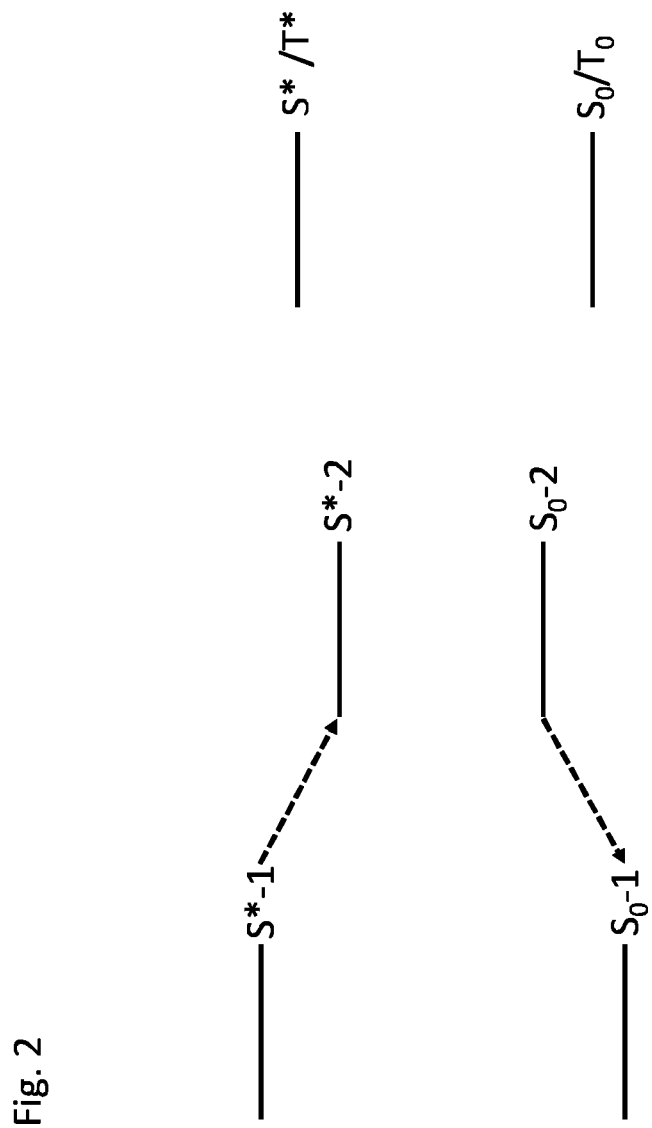

If such a dual emitter is combined with a further, e.g. phosphorescent, emitter whose energy level spacing, between the electronically excited state and the basic electronic state, is greater than the energy level spacing, between the second electronically excited state and the second basic electronic state, of the dual emitter, then the emitted radiation of the further emitter is not extinguished by reabsorption of radiation starting from the second basic electronic state of the dual emitter (see e.g. FIG. 2). For example, a dual emitter which comprises an emission from the second electronically excited state in the green spectral range can be combined in a layer with a further emitter which emits light in a blue spectral range. Therefore, the CRI value can be increased in comparison with a conventional OLED which comprises a blue-emitting emitter, in that a dual emitter which comprises an emission from the second electronically excited state in a green spectral range is additionally doped into this layer. By reason of the arrangement of two different emitters in a layer, the number of organic layers in the organic optoelectronic apparatus is reduced. Since the states, formed after electrical excitation, of the locally excited form of the green emitter are similar to those of conventional fluorescent blue emitters, it should also be expected that both materials can be doped into the same matrix without efficiency losses.

In particular, it is thus possible to increase the CRI value of an organic optoelectronic apparatus in accordance with the invention which comprises two different radiation-emitting layers in the radiation-emitting region, wherein a first layer comprises a further blue emitter and the second layer comprises further red and yellow-emitting emitters, in that a dual emitter emitting green from the second excited electronic state is introduced into the blue-emitting layer.

In a further embodiment, the radiation-emitting region comprises two directly adjacent first and second radiation-emitting layers, wherein the dual emitter is arranged in the first layer and the further emitter is arranged in the second layer. A possible reabsorption of the radiation of the further emitter starting from the second basic electronic state of the dual emitter is greatly reduced on the boundary surface of the two layers if the population of the second basic electronic state of the dual emitter is low. The latter is again the case if the transition starting from the second basic electronic state to the first basic electronic state is effected more rapidly than the radiation-emitting transition starting from the second electronically excited state to the second basic electronic state. In this case, two radiation-emitting layers comprising the further emitter and the dual emitter can advantageously be arranged directly adjacent to one another, without intermediate layers necessarily having to be introduced between these radiation-emitting layers, said intermediate layers reducing the extinguishment of the emission.

In a further embodiment of the invention, a dual emitter and a further emitter are combined in the radiation-emitting region, wherein the energy level spacing between the electronically excited state and the basic electronic state of the further emitter is between the energy level spacings of the first electronically excited state and of the first basic electronic state and the second electronically excited state and the second basic electronic state of the dual emitter (see e.g. FIG. 2). This specific arrangement of the energy level allows an energy transfer to be effected from S*-1 to the further emitter. However, if the radiation-less, intramolecular transition (ESIPT or ICT) is more rapid than the intermolecular energy transfer (which is generally the case), then no/scarcely any intermolecular energy transfer takes place.

In a further embodiment of the invention, the radiation-emitting region comprises a plurality of radiation-emitting layers, wherein the individual layers each comprise a dual emitter and the dual emitters each emit light in another spectral range. In these regions, still further emitters can also be introduced in each case, or these layers can also only contain exclusively dual emitters.

In a further embodiment of the invention, a dual emitter is used, wherein the emission is effected both from the first electronically excited state and the second electronically excited state. In particular, this can mean that an emission is present from the first excited electronic state to the first basic state in comparison with the emission from the second excited state and clearly affects the entire spectrum of the radiation emitted by the organic optoelectronic apparatus. For example, the emission from the first excited state can be between 30-80% of the total emission of the dual emitter, preferably 40-50%.

The wavelength of the light emitted from these two electronically excited states can be shifted by several 10 nm with respect to one another and can comprise a different spectral form. The emitted radiation from the second electronically excited state is less energetic and in general spectrally broader than the emitted radiation from the first electronically excited state. In this case, the total radiation emitted by the dual emitter is a superimposition of the two radiations which are emitted from the first electronic state and from the second electronic state. By changing external parameters, such as e.g. of the matrix material in which the dual emitter is introduced as a dopant, the ratio of emissions from the first and second electronically excited states can be influenced. As a result, the relative intensity of the radiation from second electronically excited state and the first electronically excited state can be varied. This likewise has an effect upon the entire spectrum of the light emitted by the organic optoelectronic apparatus.

This has the advantage that instead of two further emitters only a dual emitter can be used which demonstrates two emission peaks, e.g. the dual emitter can cover the blue part and the green part or the yellow part and the red part of the visible spectral range. The radiation emitted by the organically optoelectronic apparatus thus comprises high color stability even during a long period of operation, wherein, in contrast to conventional apparatuses, fewer emitters are required.

In a further embodiment of the invention, the organic optoelectronic apparatus comprises a radiation-emitting region which comprises a first radiation-emitting layer and a second radiation-emitting layer. The two radiation-emitting layers can be separated from one another by an intermediate layer.

In a further embodiment of the invention, a charge generation layer (CGL) is used as an intermediate layer. The charge generation layer can comprise a p-doped layer and an n-doped layer which can be separated by a thin insulation layer. When the organically optoelectronic apparatus is put into operation, charge carriers are generated which migrate into the adjacent light-emitting layer and in particular in the direction of the electrode having opposite polarity. Furthermore, a charge carrier-transporting layer can also be used as an intermediate layer.

Embodiments of the present invention are described hereinafter, in which white light-emitting organic optoelectronic apparatuses, in particular OLEDs, are produced which comprise a high CRI value and at least two radiation-emitting layers in the radiation-emitting region. White light is produced by superimposing the radiation emitted by the two radiation-emitting layers.

In a first embodiment of the invention, the first radiation-emitting layer comprises at least one dual emitter and the second radiation-emitting layer comprises at least one further emitter. For example, the first radiation-emitting layer emits light in a blue-green spectral range (430 to 570 nm), wherein the first radiation-emitting layer comprises a dual emitter which comprises an emission starting from the second electronically excited state in a green spectral range (490 to 570 nm) and a further emitter which comprises an emission in a blue spectral range (430 to 490 nm). The second radiation-emitting layer emits a radiation in the yellow-red spectral range (570 to 780 nm), wherein a yellow-emitting emitter and a red-emitting further emitter are present in this layer.

In a further embodiment, the first radiation-emitting layer emits in a yellow-red spectral range (hereinafter the respective dominance wavelength ranges of the individual layers are stated in brackets: 570 to 780 nm), wherein this radiation-emitting layer comprises a dual emitter which comprises an emission from the second electronically excited state in a red spectral range (595 to 780 nm), and comprises a further emitter which emits light in a yellow spectral range (570 to 595 nm). Furthermore, a second radiation-emitting layer and a third radiation-emitting layer can then be present which each comprise further emitters and from which one radiation is emitted in the blue spectral range and the other radiation is emitted in the green spectral range.

In a further embodiment of the invention, at least one dual emitter is arranged in each case in two radiation-emitting layers. The dual emitters comprise an emission from both electronically excited states. As a result, the entire blue-green spectral range or the yellow-red spectral can be covered in each case by one dual emitter.

In particular, it is thus possible to produce an organic optoelectronic apparatus for emitting white light, comprising:
 a first electrode,
 a radiation-emitting region arranged between the first and second electrode
 a second electrode, wherein the first and second electrodes can inject charge carriers of different polarity into the radiation-emitting region, wherein
 the radiation-emitting region comprises two different dual emitters,
 wherein the dual emitters comprise in each case a first electronically excited state and in each case a second electronically excited state which can be achieved from the first electronically excited state by intramolecular proton transfer or intramolecular charge transfer,
 wherein the dual emitters each comprise an emission starting from the first electronically excited state and second electronically excited state into the first basic state and second basic state respectively, and
 the superimposition of the radiations produces white light.

In the case of such an apparatus, only two dual emitters are required in order to obtain a white light-emitting apparatus.

The organically optoelectronic apparatus described in this invention can be designed as a bottom emitter (emission of radiation through the transparent substrate), as a top emitter (emission through a transparent encapsulation) or as a fully transparent OLED (bottom and top emission). However, the arrangement of the emitters in the different radiation-emitting layers can also be varied or inverted corresponding to the given sequence.

Further advantageous embodiments and developments of the organic optoelectronic apparatuses of the invention are apparent from the exemplified embodiments described below in conjunction with the figures. These apparatuses can be in particular white light-emitting OLEDs.

Figure 3:
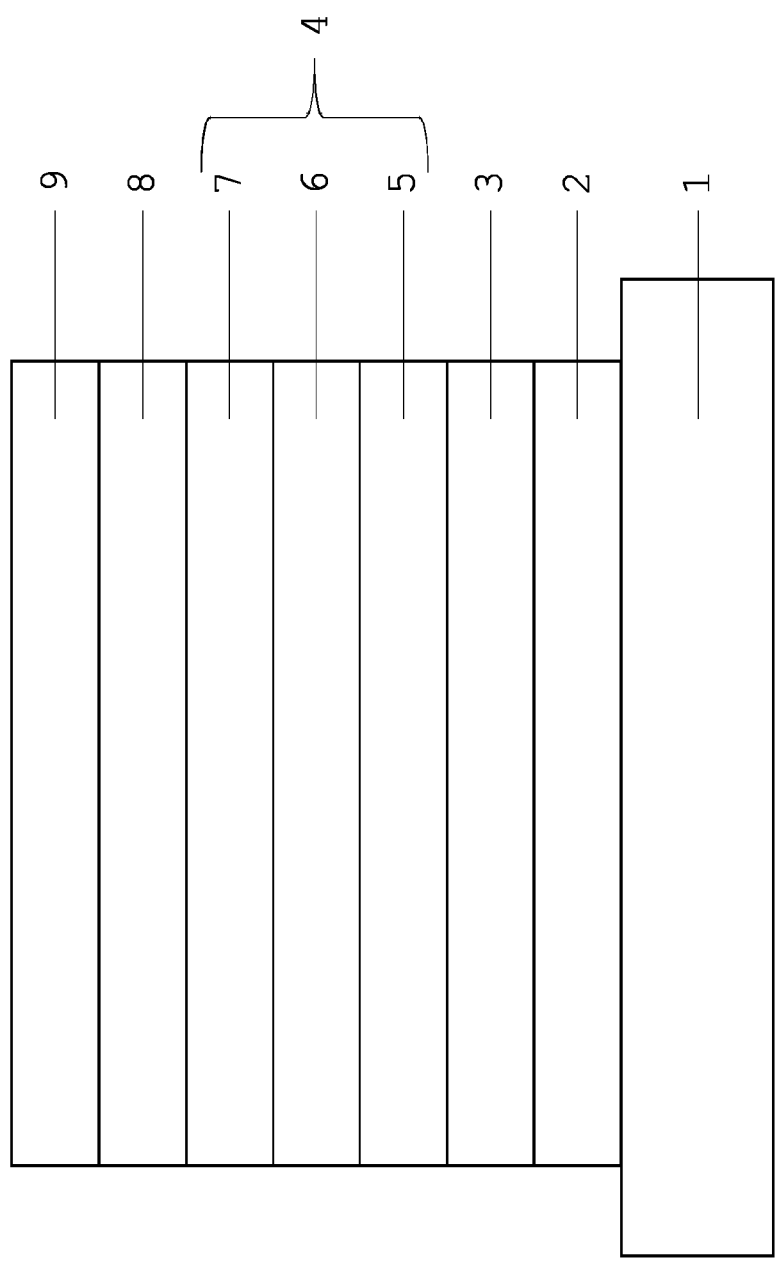
Figure 4:
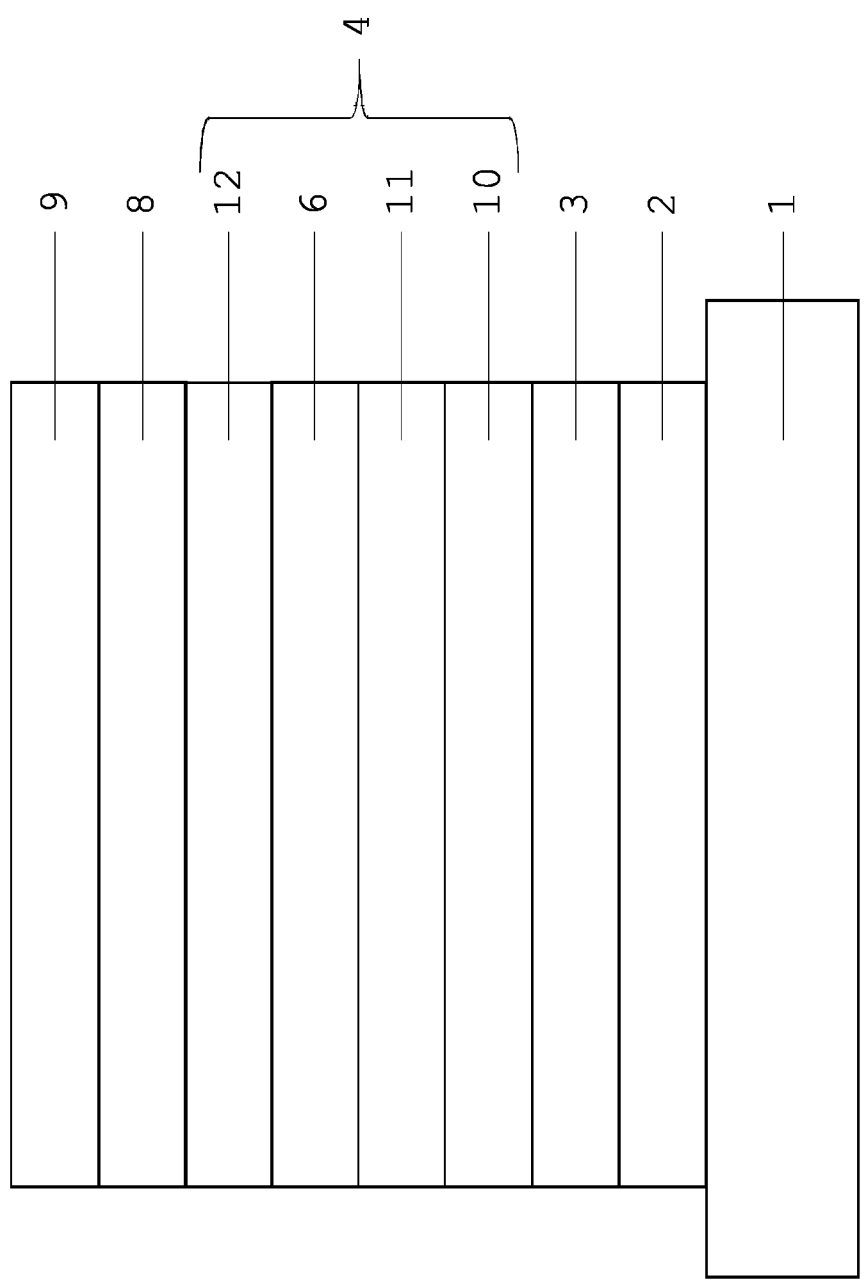
Figure 5:
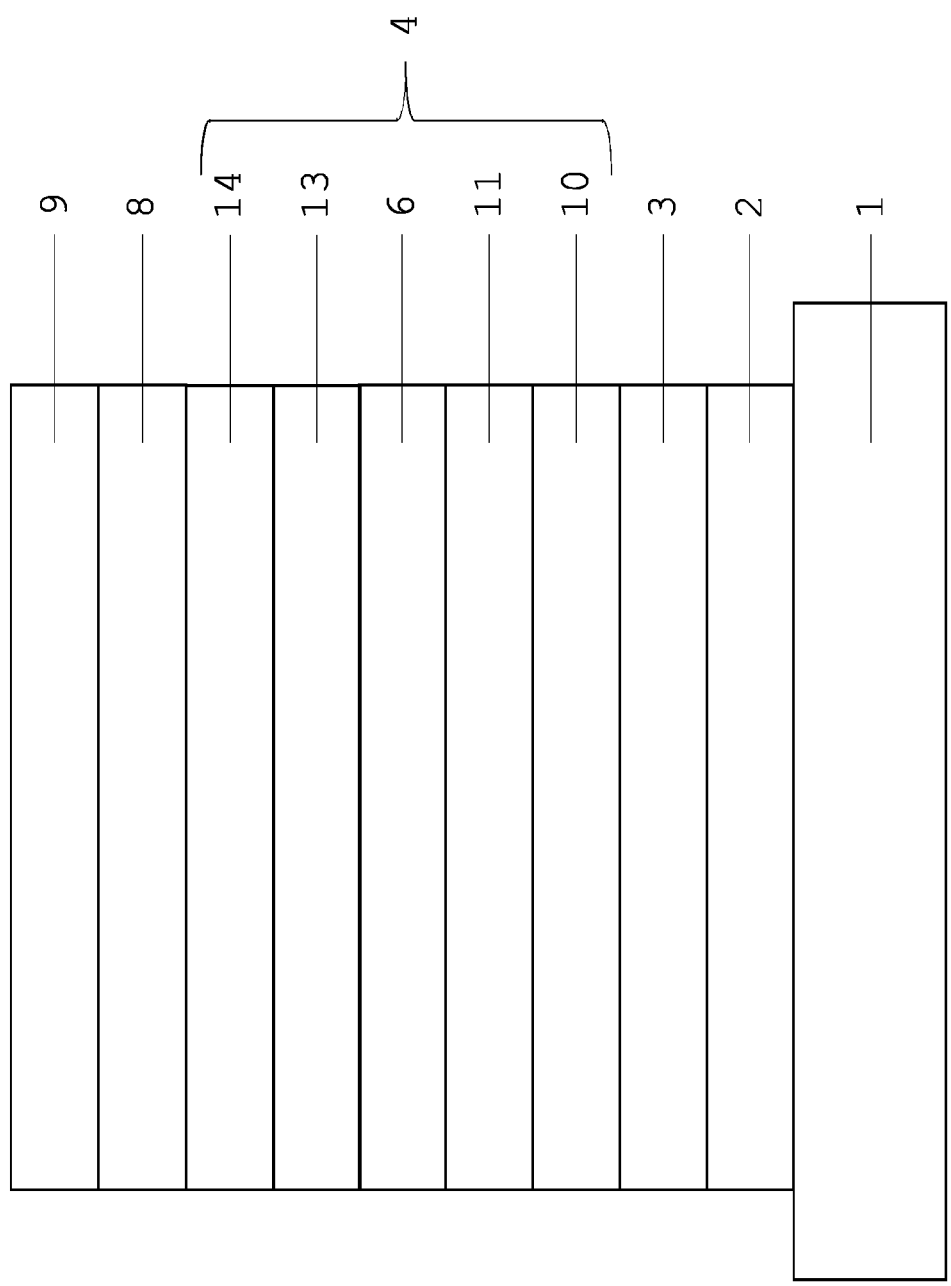
Figure 6:
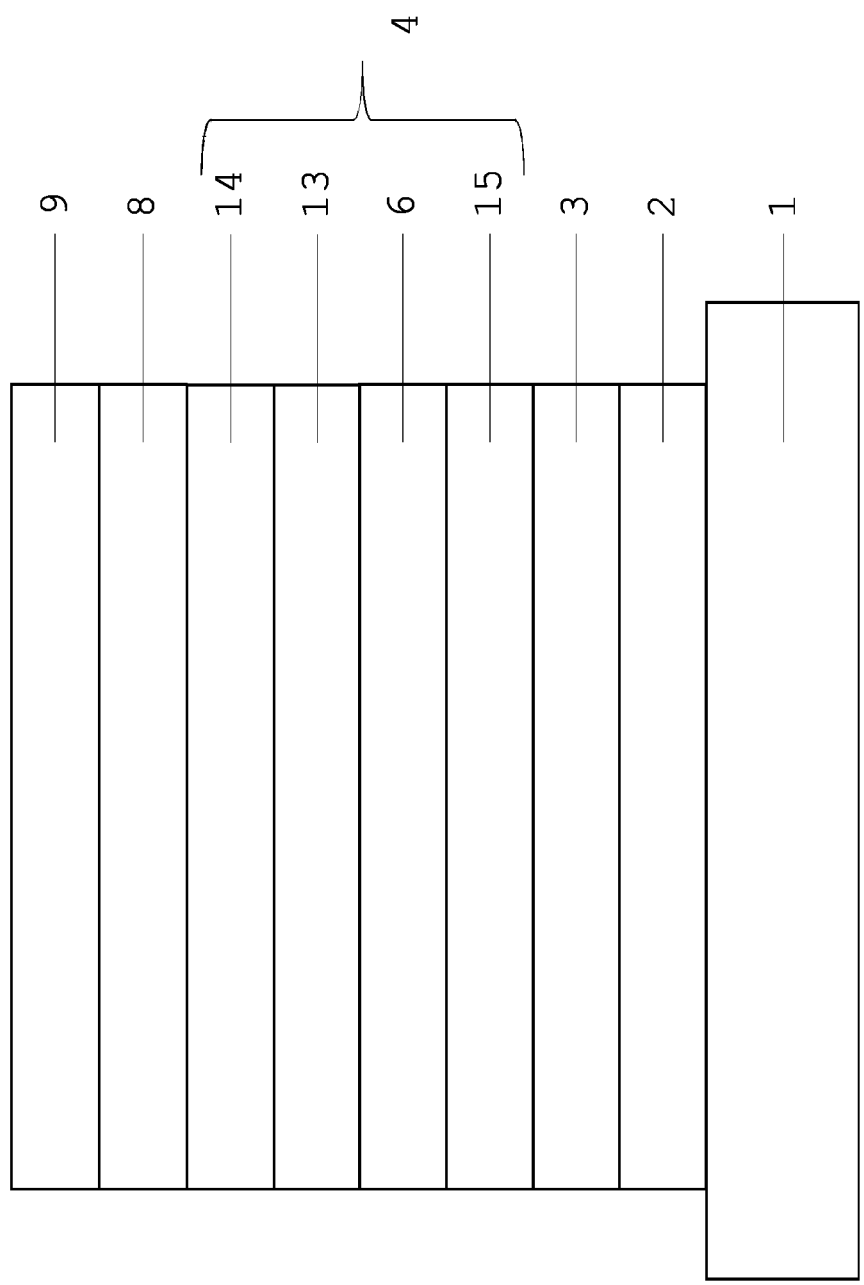
Figure 7:
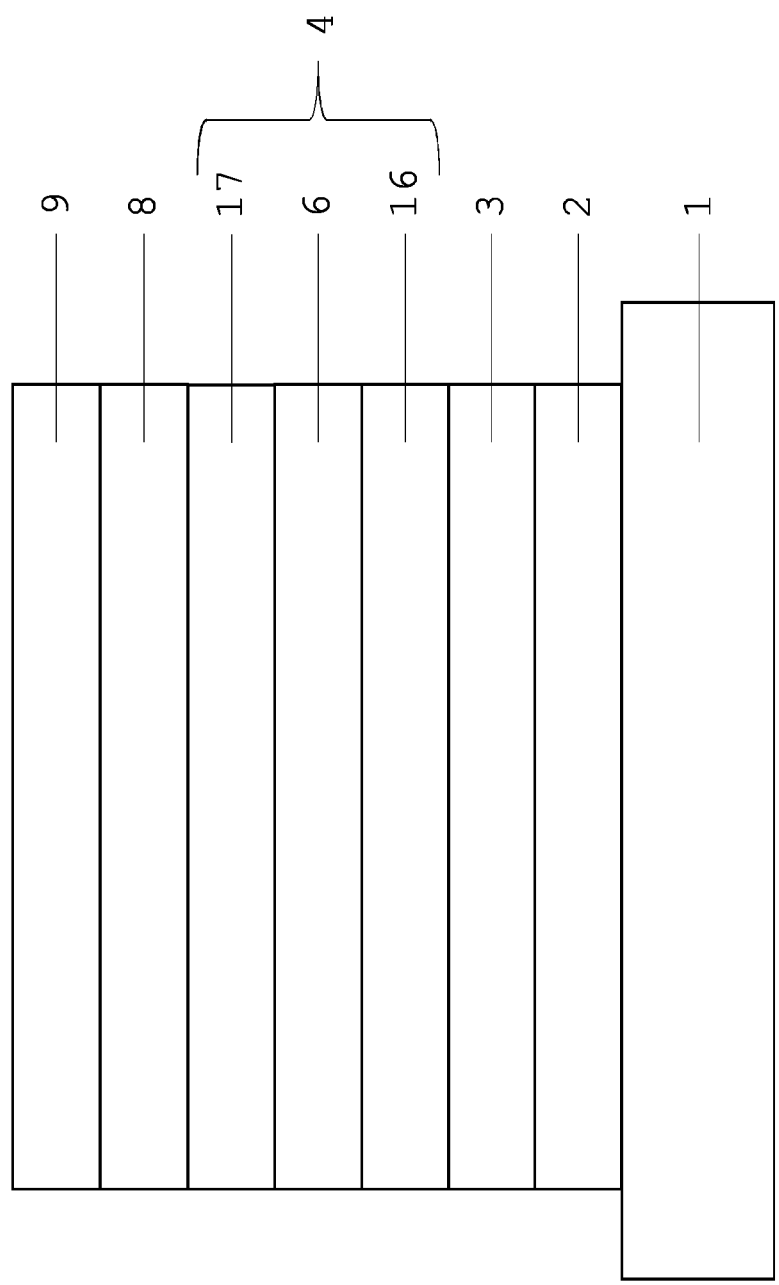
Figure 8:
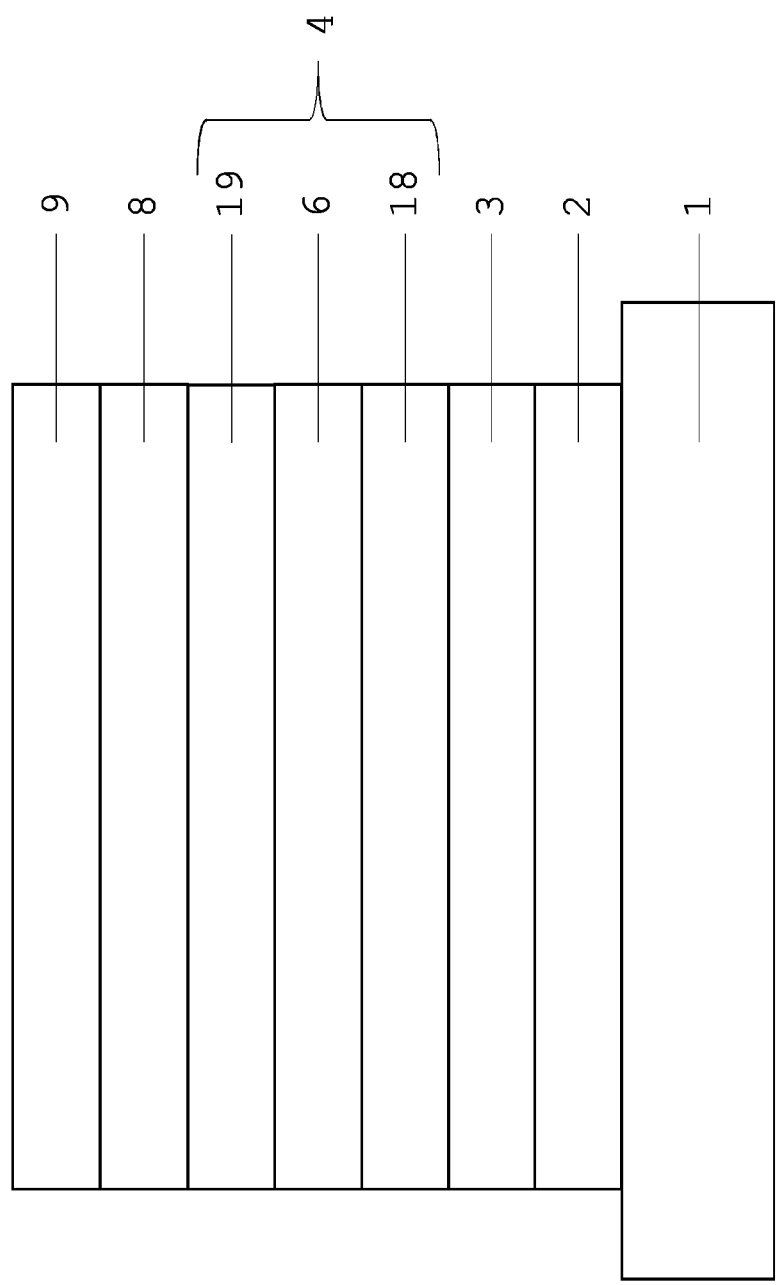
Figure 9:
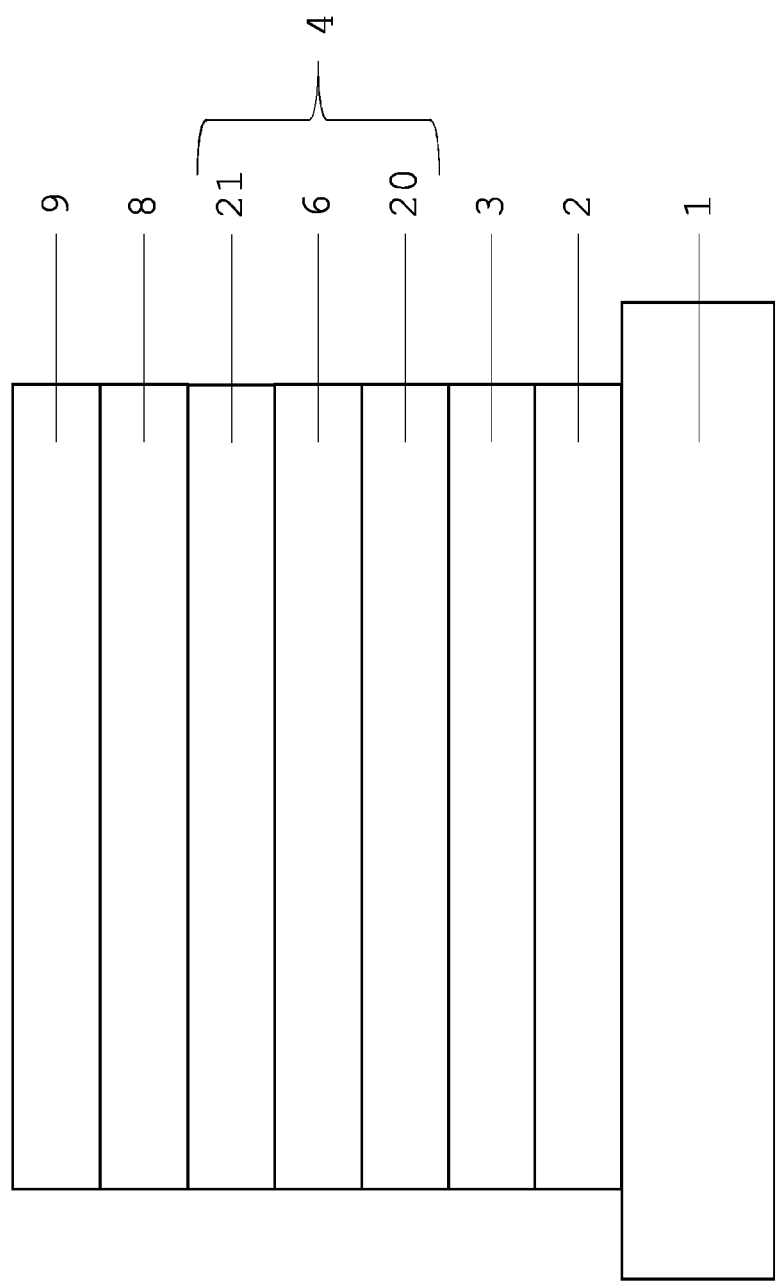

FIG. 1 shows the energy level diagram of a dual emitter,

FIG. 2 shows the energy level diagram of a dual emitter in comparison with a conventional fluorescent (S*/S0) or phosphorescent (T*/T0 or S0) emitter, FIG. 3 shows a stacked layer sequence of an organically optoelectronic apparatus according to a first exemplified embodiment of the invention, FIG. 4 shows a stacked layer sequence of an organically optoelectronic apparatus according to a second exemplified embodiment of the invention, FIG. 5 shows a stacked layer sequence of an organically optoelectronic apparatus according to a third exemplified embodiment of the invention, FIG. 6 shows a stacked layer sequence of an organically optoelectronic apparatus according to a fourth exemplified embodiment of the invention, FIG. 7 shows a stacked layer sequence of an organically optoelectronic apparatus according to a fifth exemplified embodiment, FIG. 8 shows a stacked layer sequence of an organically optoelectronic apparatus according to a sixth exemplified embodiment, FIG. 9 shows a stacked layer sequence of an organically optoelectronic apparatus according to a seventh exemplified embodiment, In the exemplified embodiments and figures, like or similar elements or elements acting in an identical manner may each be provided with the same reference numerals. The illustrated elements and their size ratios with respect to each other are not to be considered as being to scale; rather individual elements, such as e.g. layers, components, devices and regions, can be illustrated excessively large for improved clarity and/or for improved understanding.

FIG. 1 shows the energy level diagram of a dual emitter. The absorption of a photon induces an electronic transition from the first basic electronic state ($S_0$-1) to the first electronically excited state ($S^*$-1). This is followed by an intramolecular charge transfer or intramolecular proton transfer during the transition from the first electronically excited state ($S^*$-1) to the second electronically excited state ($S^*$-2). In principle, the dual emitter can emit a radiation from both electronically excited states. If the transition starting from the first electronically excited state ($S^*$-1) to the second electronically excited state ($S^*$-2) is effected more rapidly than the radiating transition from the first electronically excited state ($S^*$-1) to the first basic electronic state ($S_0$-1), an emission can be effected for the most part from the second electronically excited state ($S^*$-2). If the back reaction from the second basic electronic state ($S_0$-2) to the first basic electronic state ($S_0$-1) is effected more rapidly than the radiation-emitting decomposition starting from the second electronically excited state ($S^*$-2) to the second basic electronic state ($S_0$-2), the second basic electronic state ($S_0$-2) is scarcely populated. Therefore, the probability of the induction of an electronic transition starting from the second basic electronic state to the second electronically excited state of the dual emitter by means of reabsorption of radiation of other emitters, such as e.g. a further emitter, is extremely low.

FIG. 2 shows the energy level diagram of a dual emitter in comparison with a further emitter. The energy level spacing between the basic electronic state ($S_0$) and the electronically excited state ($S^*$) of the further emitter is between energy level spacings between the first electronically excited state ($S^*$-1) and the first basic electronic state ($S_0$-1) and the second electronically excited state ($S^*$-2) and the second basic electronic state ($S_0$-2) of the dual emitter. If the dual emitter comprises mainly an emission from the second electronically excited state ($S^*$-2), both emitters can be arranged in a layer without radiation being extinguished. As a result, no efficiency-reducing energy transfer processes occur because the transition between the first electronically excited state ($S^*$-1) and the first basic electronic state ($S_0$-1) of the dual emitter is more highly energetic than the energy level spacing between the electronically excited state ($S^*$) and the basic electronic state ($S_0$) of the further emitter and extinguishment caused by the induction of an electronic transition starting from the second basic electronic state to the second electronically excited state of the dual emitter cannot not be effected or can only be effected to a lesser extent by reason of the small population of the second basic electronic state ($S_0$-2) during a rapid transition from this state to the first basic electronic state.

FIG. 3 shows an organic optoelectronic apparatus according to a first exemplified embodiment of the invention which comprises a stacked layer sequence. An anode (2), a hole injection layer (3), a radiation-emitting region (4), an electron injection layer (8) and a cathode (9) are arranged one on top of the other on a substrate (1). The radiation-emitting region comprises a first radiation-emitting layer (5), a first intermediate layer/charge generation layer (6), a second radiation-emitting layer (7).

The first radiation-emitting layer (5) can emit e.g. radiation in a blue-green spectral range and comprises a dual emitter comprising an emission from the second electronically excited state in a green spectral range, and comprises a further emitter comprising an emission in a blue spectral range. The second radiation-emitting layer (7) emits radiation in a yellow-red spectral range. Optionally, this radiation-emitting layer can comprise a dual emitter comprising an emission from the second electronically excited state in a red spectral range, and comprises a further phosphorescent emitter which emits radiation in a yellow spectral range. Alternatively, a further emitter which emits in the red spectral range can be present in the second radiation-emitting layer.

FIG. 4 shows an organic optoelectronic apparatus according to a second exemplified embodiment of the invention. An anode (2), a hole injection layer (3), a radiation-emitting region (4), an electron injection layer (8) and a cathode (9) are arranged one on top of the other on a substrate (1). The radiation-emitting region (4) comprises a first radiation-emitting layer (10), a second radiation-emitting layer (11), a first intermediate layer/charge generation layer (6) and a third radiation-emitting layer (12). The first radiation-emitting layer (10) emits radiation in a blue spectral range, the second radiation-emitting layer (11) emits radiation in a green spectral range and the third radiation-emitting layer (12) emits radiation in a yellow-red spectral range. The first radiation-emitting layer (10) and the second radiation-emitting layer (11) are in direct contact with one another. These two radiation-emitting layers are separated from the third radiation-emitting layer (12) by an intermediate layer/charge generation layer (6). The first radiation-emitting layer (10) comprises a further emitter which emits light in a blue spectral range. The second radiation-emitting layer (11) comprises a dual emitter which comprises an emission from the second electronically excited state in a green spectral range. The third radiation-emitting layer (12) emits radiation in a yellow-red spectral range. Optionally, the third radiation-emitting layer (12) can comprise a further emitter emitting radiation in a yellow spectral range and can comprise a dual emitter comprising an emission from the second electronically excited state in a red spectral range.

FIG. 5 shows an organic optoelectronic apparatus according to a third exemplified embodiment of the invention. Again, an anode (2), a hole injection layer (3), a radiation-emitting region (4), an electron injection layer (8) and a cathode (9) are arranged one on top of the other on a substrate (1). The radiation-emitting region (4) comprises a first radiation-emitting layer (10), a second radiation-emitting layer (11), a first intermediate layer/charge generation layer (6), a third radiation-emitting layer (13) and a fourth radiation-emitting layer (14). The first radiation-emitting layer (10) and the second radiation-emitting layer (11), on the one hand, and the third radiation-emitting layer (13) and the fourth radiation-emitting layer (14), on the other hand, are in direct contact with one another. The first radiation-emitting layer (10) and the second radiation-emitting layer (11) are separated from the third radiation-emitting layer (13) and the fourth radiation-emitting layer (14) by the intermediate layer/charge generation layer (6). The first radiation-emitting layer (10) and the third radiation-emitting layer (13) comprise a further emitter, wherein the first radiation-emitting layer (10) emits radiation in a blue spectral range and the third radiation-emitting layer (13) emits radiation in a yellow spectral range. In contrast, the second radiation-emitting layer (11) and the fourth radiation-emitting layer (14) each comprise a dual emitter which comprises mainly an emission from the second electronically excited state, wherein the second radiation-emitting layer (11) emits radiation in a green spectral range and the fourth radiation-emitting layer (14) emits radiation in a red spectral range.

FIG. 6 shows an organic optoelectronic apparatus according to a fourth exemplified embodiment of the invention. Again, an anode (2), a hole injection layer (3), a radiation-emitting region (4), an electron injection layer (8) and a cathode (9) are arranged one on top of the other via a layer structure on a substrate (1). The radiation-emitting region (4) comprises a first radiation-emitting layer (15) on which a first intermediate layer/charge generation layer (6) is arranged. Located thereabove is a second radiation-emitting layer (13) and a third radiation-emitting layer (14). The second radiation-emitting layer (13) and the third radiation-emitting layer (14) are in direct contact with one another, wherein the first radiation-emitting layer (15) is separated from the second radiation-emitting layer (13) and third radiation-emitting layer (14) by an intermediate layer/charge generation layer (6). The first radiation-emitting layer (15) emits radiation in a blue-green spectral range, the second radiation-emitting layer (13) emits radiation in a yellow spectral range and the third radiation-emitting layer (14) emits radiation in a red spectral range. The first radiation-emitting layer (15) comprises a further emitter emitting radiation in a blue spectral range and comprises a dual emitter comprising mainly an emission from the second electronically excited state in a green spectral range. The second radiation-emitting layer (13) comprises a further emitter which emits radiation in a yellow spectral range. The third radiation-emitting layer (14) comprises a dual emitter which comprises mainly an emission from the second electronically excited state in the red spectral range.

FIG. 7 shows an organic optoelectronic apparatus according to a fifth exemplified embodiment of the invention. Again, in a similar manner to the previous exemplified embodiments, an anode (2), a hole injection layer (3), a radiation-emitting region (4), an electron injection layer (8) and a cathode (9) are arranged one on top of the other on a substrate (1). The radiation-emitting region (4) comprises a first radiation-emitting layer (16), a first intermediate layer/ charge generation layer (6) and, arranged thereabove, a second radiation-emitting layer (17). The first radiation-emitting layer (16) and the second radiation-emitting layer (17) are separated from one another by the intermediate layer/charge generation layer (6). The first radiation-emitting layer (16) emits radiation in a blue-green spectral range and the second radiation-emitting layer (17) emits radiation in a yellow-red spectral range. Both the first radiation-emitting layer (16) and the second radiation-emitting layer (17) comprise a dual emitter, wherein an emission is effected from both electronically excited states.

FIG. 8 shows an organic optoelectronic apparatus according to a sixth exemplified embodiment of the invention. Again, in a similar manner to the previous exemplified embodiments, the anode, cathode and the hole- and electron-injecting layer are present. The radiation-emitting region (4) comprises a first radiation-emitting layer (18), a first intermediate layer/charge generation layer (6), a second radiation-emitting layer (19). The first radiation-emitting layer (18) and the second radiation-emitting layer (19) are separated from one another by an intermediate layer/charge generation layer (6). The first radiation-emitting layer (18) emits radiation in a blue-green spectral range whereas the second radiation-emitting layer (19) emits radiation in a yellow-red spectral range. The first radiation-emitting layer (18) comprises a dual emitter emitting radiation in a blue-green spectral range, wherein the dual emitter comprises an emission from both electronically excited states. However, the second radiation-emitting layer (19) comprises further emitters which emit radiation in each case in a yellow and red spectral range.

FIG. 9 shows an organic optoelectronic apparatus according to a seventh exemplified embodiment of the invention, comprising a substrate, an anode, a cathode and the associated hole- and electron-injecting layers. The radiation-emitting region (4) comprises a first radiation-emitting layer (20), a first intermediate layer/charge generation layer (6) and a second radiation-emitting layer (21). The first radiation-emitting layer (20) and the second radiation-emitting layer (21) are separated from one another by an intermediate layer/charge generation layer (6). The first radiation-emitting layer (20) comprises a further emitter emitting radiation in a blue spectral range and comprises a dual emitter comprising mainly a radiation from the second electronically excited state in a green spectral range. However, the second radiation-emitting layer (21) comprises a dual emitter emitting radiation in a yellow-red spectral range, wherein the dual emitter comprises an emission from both electronically excited states.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:

1. An organic optoelectronic apparatus for the emission of white light, comprising:
   a first electrode,
   a second electrode,
   a radiation-emitting region arranged between the first and second electrode,
   wherein the first and second electrodes can inject charge carriers of different polarity into the radiation-emitting region,
   wherein the radiation-emitting region comprises two different dual emitters,
   wherein the radiation-emitting region comprises a first radiation-emitting layer and a second radiation-emitting layer and each of the radiation-emitting layers comprises one dual emitter,
   wherein each one of the dual emitters comprises a first electronically excited state and a second electronically excited state which can be achieved from the first electronically excited state,
   wherein the dual emitters each comprise an emission starting from the first electronically excited state and second electronically excited state into a first basic electronic state and a second basic electronic state respectively,
   wherein each of the dual emitters comprises a molecule that is selected from one of the following general formulas:

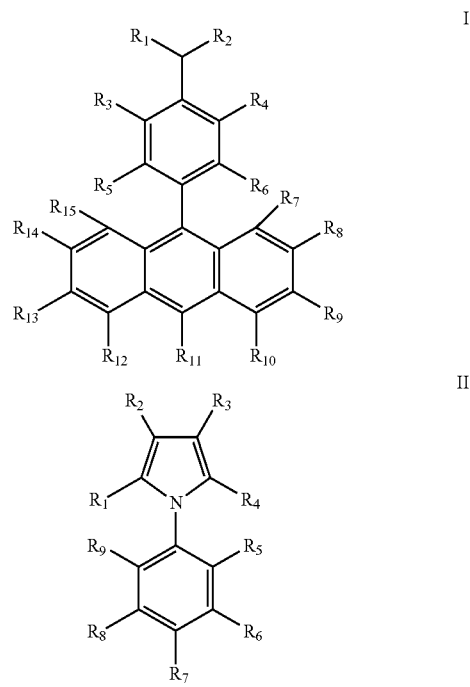

wherein $R_1$ to $R_{15}$ are hydrogen, alkyl, alkenyl groups, long-chain alkyl, alkoxy, long-chain alkoxy, cycloalkyl, haloalkyl, aryl, arylenes, haloaryl, heteroaryl, heteroarylenes, heterocycloalkylenes, heterocycloalkyl, haloheteroaryl, alkenyl, haloalkenyl, alkinyl, haloalkinyl, ketoaryl, haloketoaryl, ketoheteroaryl, ketoalkyl, haloketoalkyl, ketoalkenyl, haloketoalkenyl, or part of a cyclic, aromatic, or heteroaromatic system and
   wherein a superimposition of the radiations from each of the radiation-emitting layers produces white light.

2. The organic optoelectronic apparatus according to claim 1, wherein each dual emitter of the two different dual emitters in the radiation-emitting region emits fluorescent radiation.

3. The organic optoelectronic apparatus according to claim 1, wherein for each one of the dual emitters, an intramolecular charge transfer from the first electronically excited state to the second electronically excited state is effected more rapidly than a radiation-emitting decomposition starting from the first electronically excited state to a first basic electronic state.

4. The organic optoelectronic apparatus according to claim 1, wherein a transition starting from the second basic electronic state of each one of the dual emitters to a first basic electronic state is more rapid than a radiating transition starting from the second electronically excited state to the second basic electronic state.

5. The organic optoelectronic apparatus according to claim 1, wherein the first radiation-emitting layer and the second radiation-emitting layer are separated from one another by an intermediate layer that comprises either a charge generation layer or a charge carrier-transporting layer.

6. The organic optoelectronic apparatus according to claim 1, wherein each one of the dual emitters comprises molecules of the following general formula:

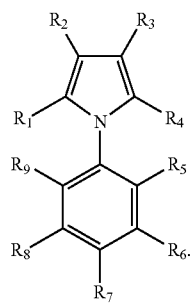

IV

7. The organic optoelectronic apparatus according to claim 1, wherein each one of the dual emitters comprises molecules of the following general formula:

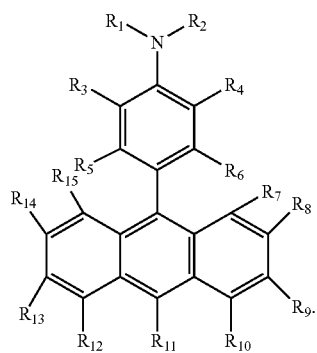

I

\* \* \* \* \*

UNITED STATES PATENT AND TRADEMARK OFFICE
CERTIFICATE OF CORRECTION

PATENT NO. : 12,312,522 B2
APPLICATION NO. : 15/128099
DATED : May 27, 2025
INVENTOR(S) : Dominik Pentlehner et al.

Page 1 of 2

It is certified that error appears in the above-identified patent and that said Letters Patent is hereby corrected as shown below:

In the Claims

Claim 1
Column 22, Lines 15-29:

Now reads: " 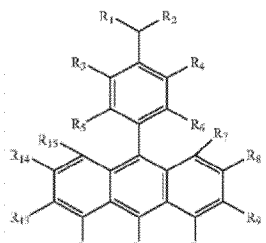 "

Should read -- 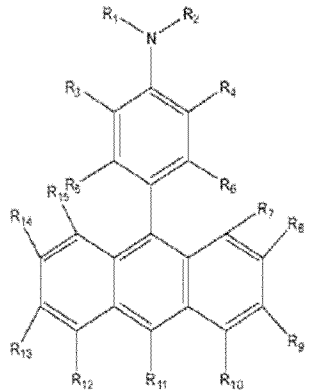 --

Signed and Sealed this
Twenty-ninth Day of July, 2025

Coke Morgan Stewart
*Acting Director of the United States Patent and Trademark Office*

CERTIFICATE OF CORRECTION (continued)
U.S. Pat. No. 12,312,522 B2

Claim 6
Column 23, Lines 12-25:

Now reads: " 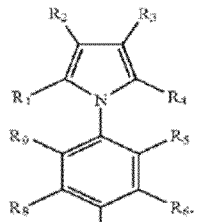 "

Should read -- 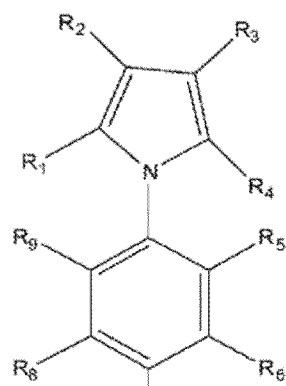 --

Claim 7
Column 24, Lines 7-20:

Now reads: " 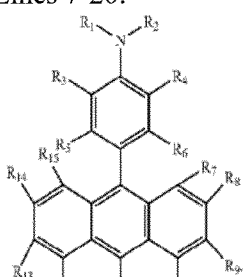 "

Should read -- 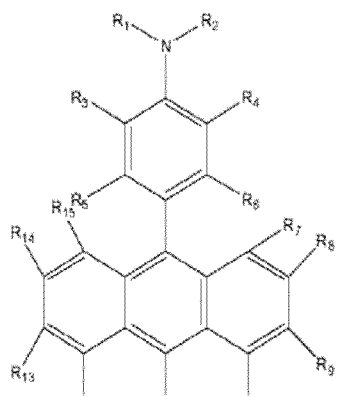 --